United States Patent
Noda et al.

(10) Patent No.: US 8,698,009 B2
(45) Date of Patent: Apr. 15, 2014

(54) PRINTED WIRING BOARD AND METHOD FOR MANUFACTURING THE SAME

(75) Inventors: Kota Noda, Ogaki (JP); Tsutomu Yamauchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/435,450

(22) Filed: Mar. 30, 2012

(65) Prior Publication Data
US 2012/0186868 A1    Jul. 26, 2012

Related U.S. Application Data

(62) Division of application No. 12/757,163, filed on Apr. 9, 2010.

(60) Provisional application No. 61/185,227, filed on Jun. 9, 2009.

(51) Int. Cl.
*H05K 1/11* (2006.01)

(52) U.S. Cl.
USPC .......................................... 174/264; 174/262

(58) Field of Classification Search
None
See application file for complete search history.

(56) References Cited

U.S. PATENT DOCUMENTS

| | | | |
|---|---|---|---|
| 2,986,804 A | 6/1961 | Greenman et al. | |
| 3,411,204 A | 11/1968 | Reid | |
| 6,211,468 B1 * | 4/2001 | Windschitl | 174/254 |
| 6,423,934 B2 * | 7/2002 | Hasegawa et al. | 219/121.71 |
| 7,284,323 B2 * | 10/2007 | Cheng | 29/853 |
| 7,786,390 B2 * | 8/2010 | Ikeda | 174/255 |
| 2006/0191715 A1 | 8/2006 | Koyama et al. | |
| 2008/0203420 A1 * | 8/2008 | Higaki et al. | 257/99 |
| 2009/0194322 A1 * | 8/2009 | Usui et al. | 174/260 |
| 2010/0307807 A1 | 12/2010 | Noda et al. | |

FOREIGN PATENT DOCUMENTS

| | | |
|---|---|---|
| JP | 2002-523891 | 7/2002 |
| JP | 2003-347700 | 12/2003 |
| JP | 2004-363212 | 12/2004 |
| JP | 2006-041463 | 2/2006 |
| JP | 2008-78343 | 4/2008 |
| WO | WO 00/10370 A1 | 2/2000 |

OTHER PUBLICATIONS

U.S. Appl. No. 13/434,162, filed Mar. 29, 2012, Noda, et al.

* cited by examiner

*Primary Examiner* — Ishwarbhai B Patel
(74) *Attorney, Agent, or Firm* — Oblon, Spivak, McClelland, Maier & Neustadt, L.L.P.

(57) ABSTRACT

A wiring board having a penetrating hole formed by forming holes with different shapes from both surfaces of a substrate. In such a penetrating hole, the depth of a first opening portion formed in the first-surface side of the substrate is shallower than the depth of a second opening portion formed in the second-surface side, and the diameter of a first opening is greater than the diameter of a second opening. Even if the gravity line of the first opening portion and the gravity line of the second opening portion are shifted from each other, the region of the second opening portion inserted into the inner space of the first opening portion may be made larger.

17 Claims, 21 Drawing Sheets

$\Delta V2a = \Delta V21a + \Delta V22a$ $\Delta V2b = \Delta V21b + \Delta V22b$ $\Delta V2b > \Delta V2a$ $|\Delta Z1/\Delta X| < |\Delta Z2/\Delta X|$

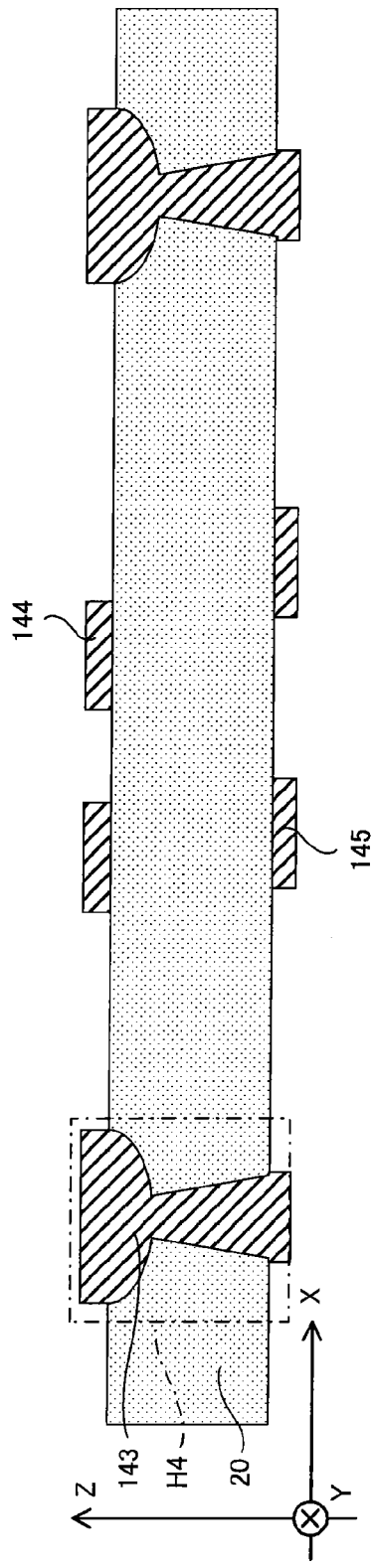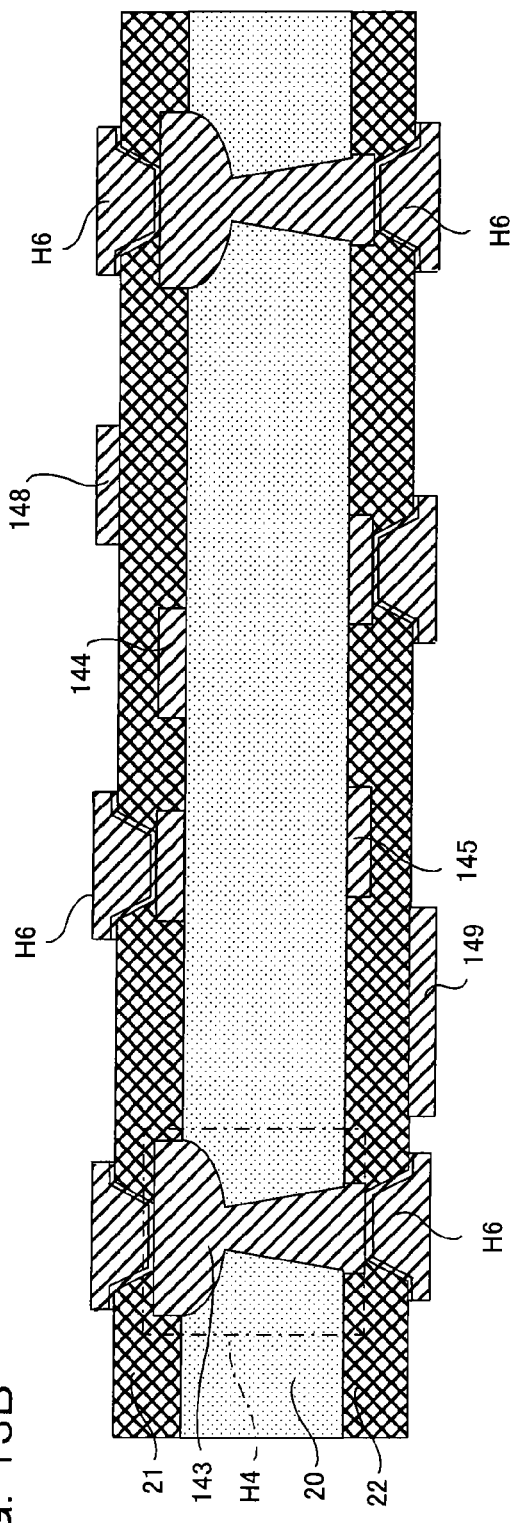

PRINTED WIRING BOARD AND METHOD FOR MANUFACTURING THE SAME

CROSS-REFERENCE TO RELATED APPLICATIONS

The present application is a divisional of and claims the benefit of priority to U.S. application Ser. No. 12/757,163, filed Apr. 9, 2010, which is based upon and claims the benefit of priority to U.S. Application No. 61/185,227, filed Jun. 9, 2009. The entire contents of these applications are incorporated herein by reference.

BACKGROUND OF THE INVENTION

1. Field of the Invention

The present invention is related to a printed wiring board and its manufacturing method, especially to a wiring board having a penetrating hole and to its manufacturing method.

2. Discussion of the Background

In Japanese Laid-Open Patent Publication 2006-41463, a method is disclosed to form a through-hole in a substrate by forming a penetrating hole with a cross section of an hourglass-shape (the shape of a traditional Japanese hand-drum) and by performing plating to fill metal in the penetrating hole. The penetrating hole with an hourglass-shaped cross section is made up of a first cone-shaped blind hole formed on one side of the substrate and a second cone-shaped (in a shape of a hand-drum) blind hole formed on the other side of the substrate. The contents of this publication are incorporated herein by reference in their entirety.

SUMMARY OF THE INVENTION

A method for manufacturing a printed wiring board according to the first aspect of the present invention is as follows: preparing a substrate having a first surface and a second surface opposite the first surface; in a first-surface side of the substrate, forming a first opening portion whose inner diameter decreases from the first surface to the second surface and which has a first opening on the first surface; by forming in a second-surface side of the substrate a second opening portion whose inner diameter decreases from the second surface toward the first surface and which has a second opening on the second surface, forming a penetrating hole which penetrates the substrate by joining the first opening portion and the second opening portion; forming a first conductive circuit on the first surface of the substrate; forming a second conductive circuit on the second surface of the substrate; and by filling the penetrating hole with plating, forming a through-hole conductor electrically connecting the first conductive circuit and the second conductive circuit. In such a method for forming a printed wiring board, diameter (R1) of the first opening is the same as or greater than the diameter (R2) of second opening, and depth (D1) of the first opening portion is less than depth (D2) of the second opening portion.

A printed wiring board according to the second aspect of the present invention is formed with the following: a substrate having a first surface and a second surface opposite the first surface, and having a penetrating hole where a first opening portion, which is formed in the first-surface side with the inner diameter decreasing from the first surface toward the second surface, and a second opening portion, which is formed in the second-surface side with the inner diameter decreasing from the second surface toward the first surface, are joined; a first conductive circuit formed on the first surface of the substrate; a second conductive circuit formed on the second surface of the substrate; and a through-hole conductor made of metal filled in the penetrating hole and connecting the first conductive circuit and the second conductive circuit. In such a wiring board, the first opening portion has depth (D1) and has a first opening with diameter (R1) on the first surface, the second opening portion has depth (D2) and has a second opening with diameter (R2) on the second surface, diameter (R1) of the first opening is the same as or greater than diameter (R2) of the second opening, and depth (D1) of the first opening portion is less than depth (D2) of the second opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 13A-13D are cross-sectional views showing the steps to manufacture a core substrate of a multilayer board according to an applied example;

DETAILED DESCRIPTION OF THE EMBODIMENTS

Figure 1A:
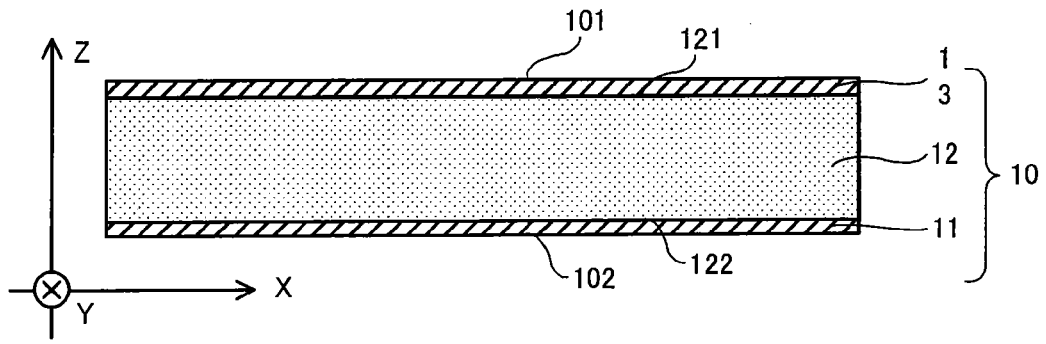
FIGS. 1A-1F are cross-sectional views showing the steps to manufacture a through-hole conductor of a wiring board according to the First Embodiment of the present invention.

The embodiments will now be described with reference to the accompanying drawings, wherein like reference numerals designate corresponding or identical elements throughout the various drawings.

In Japanese Laid-Open Patent Publication 2006-41463, a first blind hole formed in a surface of a substrate and a second blind hole formed in the other surface of the substrate have substantially the same depth. In such a case, to form a penetrating hole, it is believed that the positions of the first blind hole and the second blind hole are required to be aligned with a high degree of accuracy. If the position of the first blind hole and the position of the second blind hole are shifted from each other, the first and second blind holes will not be joined and it is thought to be difficult to form a penetrating hole. Therefore, it is thought that the productivity of penetrating holes will most likely be reduced when using a method for forming a penetrating hole according to Japanese Laid-Open Patent Publication 2006-41463.

The present embodiments are to improve such shortcomings of the prior art. The following describes a method for manufacturing a wiring board according to the embodiments and describes a wiring board manufactured by such a manufacturing method.

First Embodiment

In the following, a method for manufacturing a wiring board with a through-hole conductor is described according to the First Embodiment.

Figure 1B:
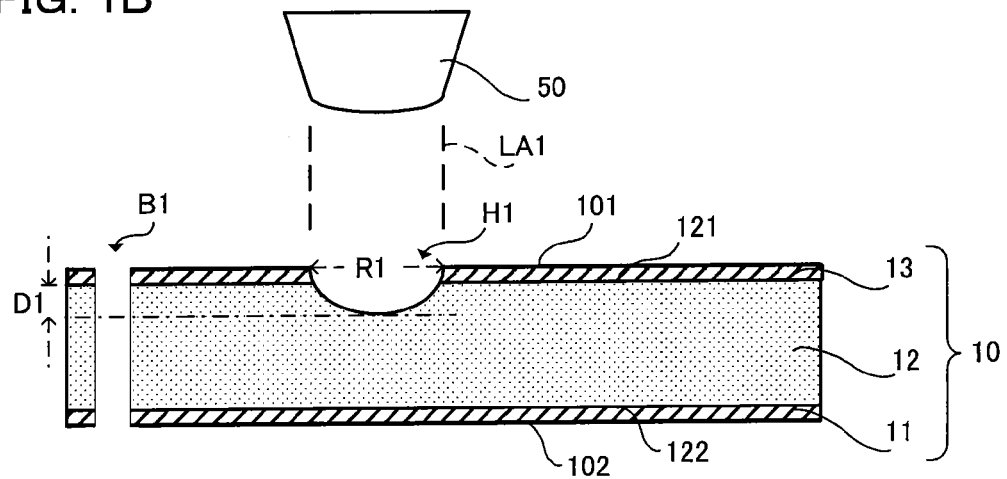
Figure 1C:
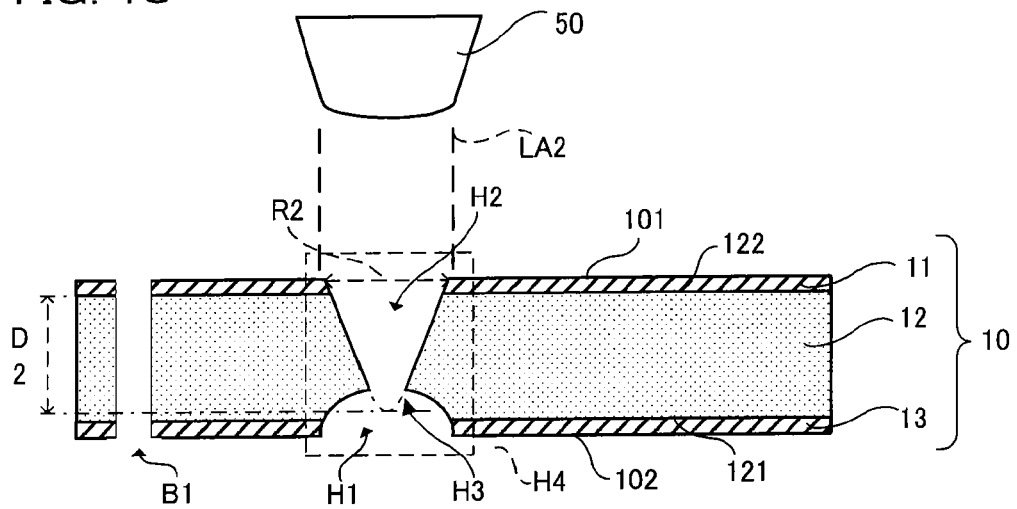
Figure 1D:
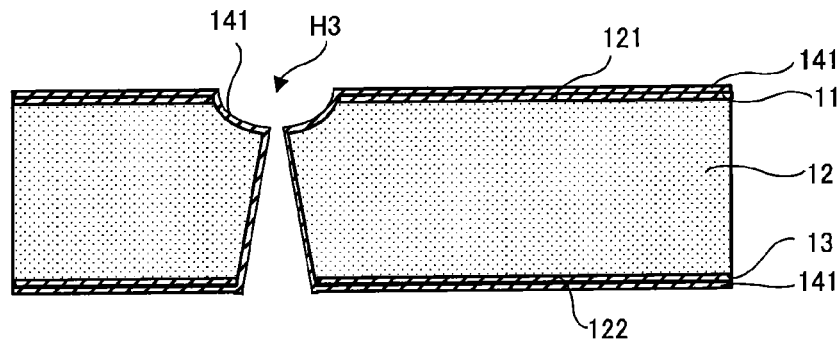
Figure 1E:
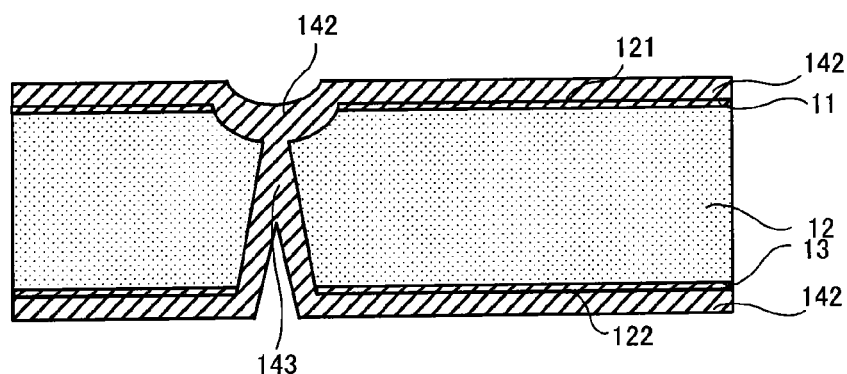
Figure 1F:
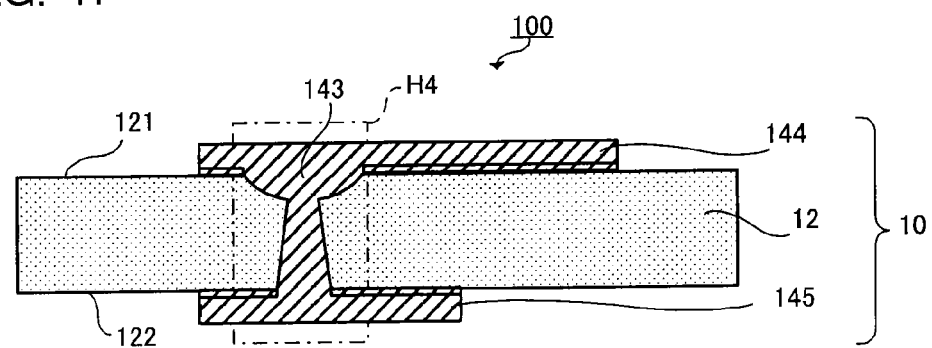

An outline of the manufacturing method is as follows: i) as shown in FIG. 1B, forming blind hole (H1) in one side of substrate 12; ii) as shown in FIG. 1C, forming penetrating hole (H4) by forming blind hole (H2) in the other side of substrate 12 to be joined with blind hole (H1); and iii) as shown in FIG. 1F, forming through-hole conductor 143 by performing plating to fill penetrating hole (H4) with copper.

Specific descriptions of the manufacturing method are provided in the following by referring to the drawings.

First, copper-clad laminate 10 as shown in FIG. 1A is prepared. Copper-clad laminate 10 is formed with substrate 12, copper-foil layer 13 formed on first surface 121 of substrate 12 and copper-foil layer 11 formed on second surface 122 of substrate 12. FIGS. 1A-1F are cross-sectional views of copper-clad laminate 10 on an X-Z plane. On the X-Z plane, a straight line perpendicular to first surface 121 and second surface 122 of substrate 12 is set as axis Z, and a straight line parallel to the longitudinal direction of substrate 12 is set as axis X.

Substrate 12 is made of an insulative substrate, for example, epoxy resin, polyimide resin, bismaleimide triazine resin (BT resin), allyl polyphenylene ether resin (A-PPE resin) or the like. Also, substrate 12 may be a fabric-reinforced substrate formed with cured resin and reinforcing material such as glass cloth, glass non-woven fabric or aramid non-woven fabric.

To form a penetrating hole with a laser, the thickness of substrate 12 is preferred to be set between 0.1 mm-0.8 mm. Moreover, the thickness of substrate 12 is especially preferred to be set between 0.15 mm-0.45 mm. If the thickness of substrate 12 is in such a range, a penetrating hole may be easily formed in copper-clad laminate 10 or substrate 12 by a laser while ensuring the strength of substrate 12.

In the descriptions below, copper-clad laminate 10 is formed with substrate 12 made of glass epoxy with a thickness of 0.3 mm and copper-foil layers (11, 13) with a thickness of 5 μm laminated on both surfaces of the substrate.

Figure 2A:
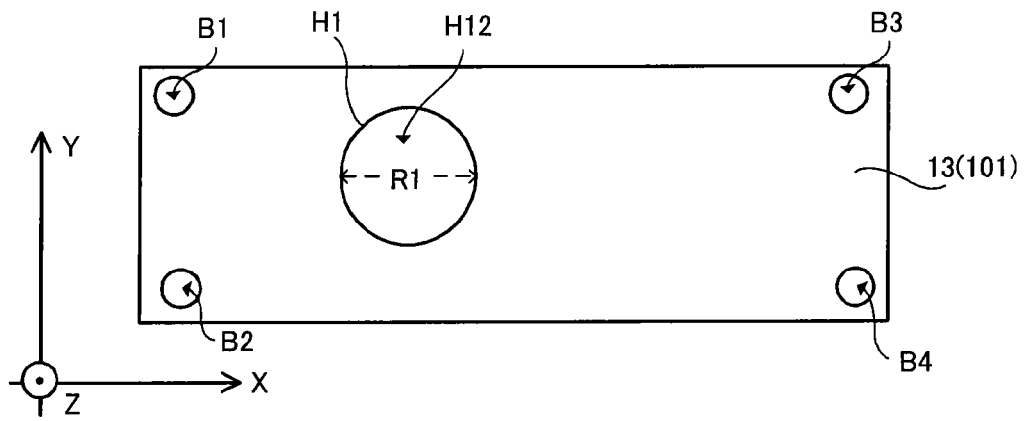
FIGS. 2A-2C are plan views showing the steps to manufacture a penetrating hole and a conductive circuit of the wiring board according to the First Embodiment.

Next, as shown in FIG. 2A, using a drill or a laser, base hole (penetrating hole) (B1, B2, B3 or B4) is formed at each corner of copper-clad laminate 10. Base holes (B1, B2, B3, B4) function as marks for alignment.

Next, to increase absorption efficiency of laser beams in copper-clad layers (11, 13), a black-oxide treatment is performed to oxidize their surfaces, and copper-foil layers (11, 13) become copper oxide with capillary crystal surfaces.

Then, copper-clad laminate 10 is set in laser processing equipment so that one main surface 101 of copper-clad laminate 10 will be irradiated with a laser.

Next, according to base holes (B1-B4), a laser beaming position of the laser processing equipment is aligned with a predetermined spot for forming a through-hole conductor in copper-clad laminate 10 (namely, a predetermined spot for forming blind hole (H1)).

Moreover, based on the shape, size (diameter) and depth of blind hole (H1) to be formed, the diameter, laser intensity, energy per pulse, number of pulses and the like of the laser to be irradiated are set.

Then, as shown in FIG. 1B, laser (LA1) is irradiated at one main surface 101 of copper-clad laminate from laser beaming device 50 of the laser processing equipment to form first blind hole (opening portion) (H1) tapered from first surface 121 of substrate 12 toward second surface 122. Namely, blind hole (H1) is formed whose inner diameter becomes gradually smaller from first surface 121 of substrate 12 toward second surface 122. As shown in FIG. 2A, first blind hole (H1) has first opening (H12) on first surface 121 of substrate 12.

As shown in FIG. 2A, opening (H12) of first blind hole (H1) is preferred to be circular. Also, diameter (R1) at opening (H12) of first blind hole (H1) is preferred to be set between 50-300 μm. In addition, depth (D1) of first blind hole (H1) from first surface 121 of substrate 12 is preferred to be set at ⅙ or more, but ⅔ or less, of the thickness of substrate 12. In the First Embodiment, since the thickness of substrate 12 is set at 0.3 mm, depth (D1) is preferred to be approximately 0.05-0.20 mm.

Next, copper-clad laminate 10 is inverted and set in laser processing equipment so that the other main surface 102 of copper-clad laminate 10 will be irradiated with a laser. Then, according to base holes (B1-B4), the position to irradiate the laser and the position of copper-clad laminate 10 are adjusted so that the laser beaming position will correspond to the position of first blind hole (H1). Moreover, according to the shape and the size of second blind hole (H2) to be formed, the laser diameter, laser intensity, energy per pulse and the number of laser pulses and so forth are adjusted.

Figure 2B:
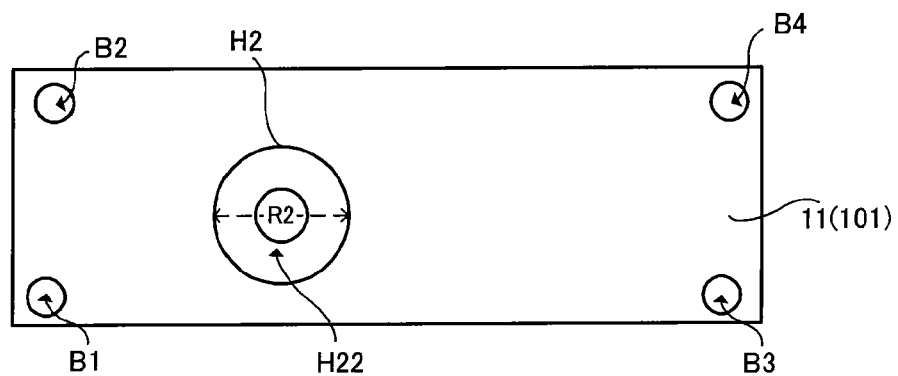

Next, as shown in FIG. 1C, laser (LA2) is irradiated at the other main surface 102 of copper-clad laminate 10 from laser beaming device 50 of the laser processing equipment to form second blind hole (opening portion) (H2) in such a way that it will be joined with first blind hole (H1). Here, since second blind hole (H2) is joined with first blind hole (H1), it is not a blind hole in a strict meaning. However, if second blind hole (H2) is not yet joined with first blind hole (H1) (assuming that first blind hole (H1) is not formed yet), namely, as an independent body, it is a blind hole. Therefore, in the present specification, hole (H2) is referred to as a blind hole. As shown in FIG. 2B, second blind hole (H2) has second opening (H22) formed on second surface 122 of substrate 12.

As shown in FIG. 1C, second blind hole (H2) tapers from second surface 122 of substrate 12 toward first surface 121. In addition, the planar shape of opening (H22) of second blind hole (H2) is preferred to be circular, as shown in FIG. 2B. Moreover, diameter (R2) at opening (H22) of second blind hole (H2) is preferred to be the same as or smaller than diameter (R1) at opening (H12) of first blind hole (H1); it is preferred to be 50-300 μm. In the present embodiment, diameter (R2) at opening (H22) of second blind hole (H2) is set at 150 μm, the same as diameter (R1) at opening (H12) of first blind hole (H1). Also, depth (D2) of second blind hole (H2) from second surface 122 of substrate 12 is to reach first blind hole (H1) and is preferred to be set at ⅕ or more, but ⅚ or less, of the thickness of substrate 12. In the present embodiment, since the depth of substrate 12 is set at 0.3 mm, depth (D2) is preferred to be 0.06 mm-0.25 mm. In the First Embodiment, depth (D2) of second blind hole (H2) is set at 0.225 mm. (D2) is the distance from second surface 122 of substrate 12 to the virtual vertex of second blind hole (H2) (the vertex when blind hole (H1) is assumed not to exist).

A cross section along an axis of penetrating hole (H4) formed by joining second blind hole (H2) and first blind hole (H1) is shaped like an hourglass (a shape like a hand drum).

By forming first blind hole (H1) and second blind hole (H2) which satisfy the above conditions, penetrating hole (H4) may be formed in copper-clad laminate 10 with high-yield rates. Such conditions for forming penetrating holes are summarized as (1)-(3) below:

(1) depth (D1) of first blind hole (H1)+depth (D2) of second blind hole (H2)> the thickness of substrate 12;

(2) depth (D1) of first blind hole (H1)<depth (D2) of second blind hole (H2); and (3) diameter (R1) at opening (first opening) (H12) of first blind hole (H1) diameter (R2) at opening (second opening) (H22) of second blind hole (H2).

Here, the advantage in satisfying above condition (1) is described.

Figure 3A:
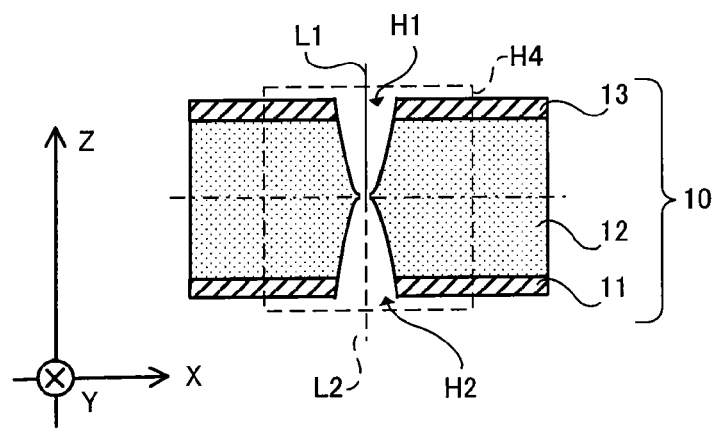
FIG. 3A is a cross-sectional view showing a case in which the positions of gravity lines of a first blind hole and a second blind hole coincide with each other.
Figure 3B:
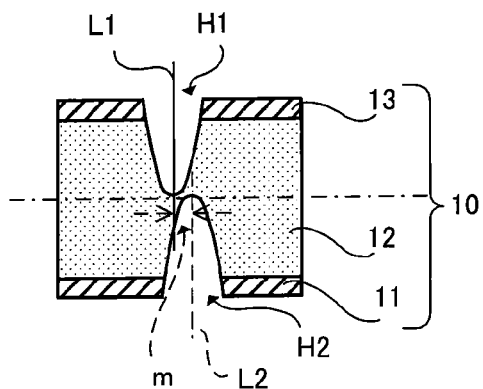
FIGS. 3B and 3C are cross-sectional views showing cases in which the positions of gravity lines of a first blind hole and a second blind hole are shifted from each other.

As shown in FIG. 3A, when the sum of depth (D1) of first blind hole (H1) and depth (D2) of second blind hole (H2) is the same as the thickness of substrate 12, if gravity line (L1) of first blind hole (H1) coincides with gravity line (L2) of second blind hole (H2), first blind hole (H1) and second blind hole (H2) are joined. As a result, penetrating hole (H4) which penetrates substrate 12 is formed. However, as shown in FIG. 3B, if the position of gravity line (L1) and the position of gravity line (L2) are shifted from each other even slightly, first blind hole (H1) and second blind hole (H2) will not be joined. As a result, penetrating hole (H4) cannot be formed.

Figure 3C:
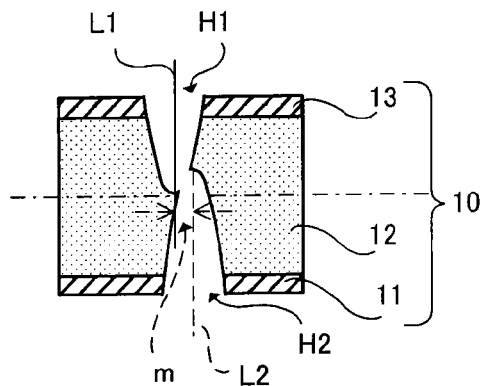

When condition (1) is satisfied (namely, the sum of depth (D1) and depth (D2) is greater than the thickness of substrate 12), even if the position of gravity line (L1) and the position of gravity line (L2) are shifted from each other the same amount (m) as shown in FIG. 3B, first blind hole (H1) and second blind hole (H2) tend to join each other as shown in FIG. 3C. As a result, penetrating hole (H4) will be formed.

Here, gravity line (L1) is a straight line passing through the gravity center of the first opening and perpendicular to the first surface of substrate 12; and gravity line (L2) is a straight line passing through the gravity center of the second opening and perpendicular to the first surface of substrate 12.

Next, the advantage of satisfying above condition (2) is described.

Figure 4A:
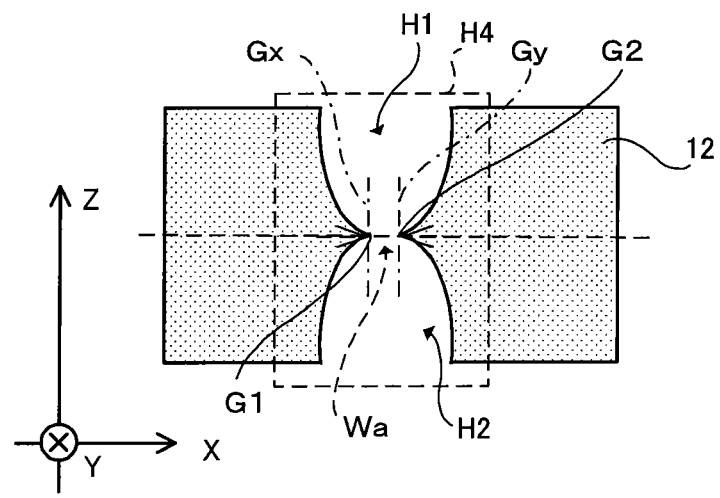
FIG. 4A is a cross-sectional view showing a case in which the depths of a first blind hole and a second blind hole are the same.
Figure 4B:
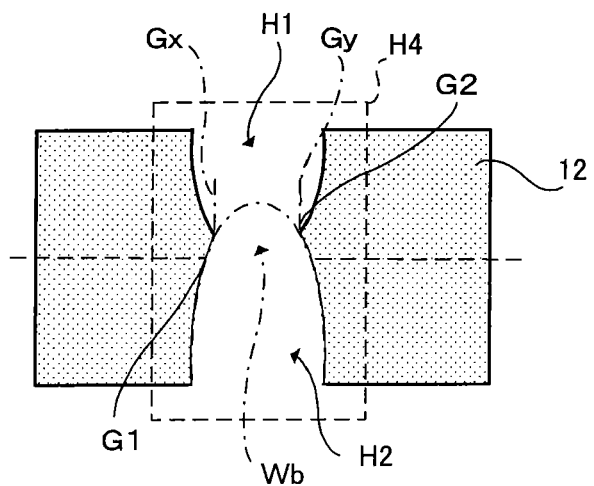
FIG. 4B is a cross-sectional view showing a case in which a second blind hole is deeper than a first blind hole.

In cross-sectional views in FIGS. 4A and 4B, one inner-wall surface of the portion where first blind hole (H1) and second blind hole (H2) are connected is set as (G1) and the other inner-wall surface as (G2). A straight line tangent to inner-wall surface (G1) and perpendicular to first surface 121 of substrate 12 is set as (Gx); and a straight line tangent to inner-wall surface (G2) and perpendicular to first surface 121 is set as (Gy). The distance between vertical line (Gx) and vertical line (Gy) constitutes the minimum values (Wa, Wb) of the inner diameter of penetrating hole (H4). FIG. 4A shows the minimum diameter (Wa) when depth (D1) and depth (D2) are the same; and FIG. 4B shows the minimum diameter (Wb) when depth (D2) is greater than depth (D1). When minimum diameter (Wa) and minimum diameter (Wb) are compared, minimum diameter (Wb) is greater than minimum diameter (Wa).

The above indicates that when condition (2) is satisfied, since second blind hole (H2) is inserted into first blind hole (H1), first blind hole (H1) and second blind hole (H2) tend to join together even if gravity line (L1) and gravity line (L2) are shifted from each other. Therefore, when condition (2) is satisfied, first blind hole (H1) and second blind hole (H2) will be joined together almost certainly so that penetrating hole (H4) may be formed.

In the present embodiment, regarding condition (3), a case is described where diameter (R1) at opening (H12) of first blind hole (H1) is the same as diameter (R2) at opening (H22) of second blind hole (H2). Another case where diameter (R2) is smaller than diameter (R1) will be described in the Second Embodiment.

A desmearing treatment is conducted on the inner walls of penetrating hole (H4) formed by the method and under the conditions described above to remove smears remaining inside penetrating hole (H4).

Figure 2C:
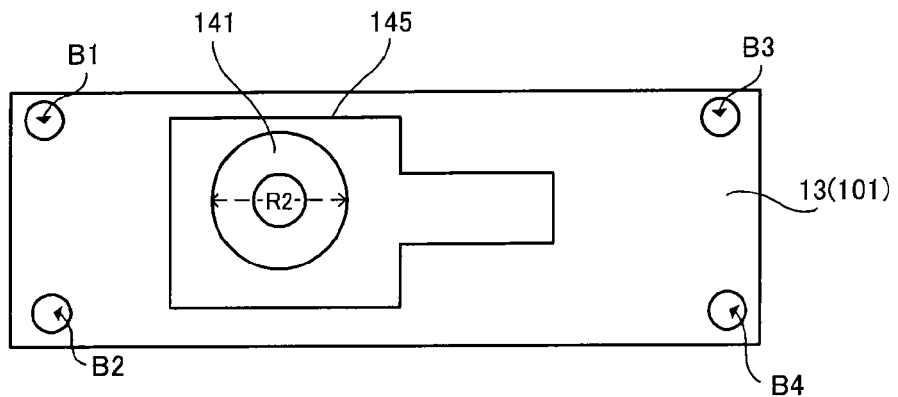

Next, as shown in FIGS. 1D and 2C, electroless plating is performed to form electroless plated-metal film (electroless copper-plated film 141) on the inner walls of penetrating hole (H4) and both main surfaces (101, 102) of copper-clad laminate 10.

Then, as shown in FIG. 1E, using electroless copper-plated film 141 as a seed layer, electrolytic copper plating is performed to form electrolytic copper-plated film 142. During that time, penetrating hole (H4) is filled with electrolytic copper-plated film 142, and through-hole conductor 143 is formed.

At that time, since the area of joined portion (H3) of penetrating hole (H4) is narrow, the narrow area is filled first and the copper starts depositing from the filled portion to grow through-hole conductor 143. As through-hole conductor 143 grows, air or the like is expelled from penetrating hole (H4). Accordingly, so-called voids, which are formed by air trapped inside penetrating hole (H4), seldom occur.

Also, since the hole diameter of penetrating hole (H4) is small and penetrating hole (H4) is filled with electrolytic copper-plated film 142 formed by electrolytic copper plating, filling resin or the like in through-hole conductor 143 is not required.

If the opening diameters of penetrating hole (H4) (diameter (R1) of first opening (H12) and diameter (R2) of second opening (H22)) are set in the range of 50 μm-300 μm, it may be easier to ensure connection reliability in through-hole conductor 143 while achieving narrow pitch among multiple through-hole conductors 143. In addition, if minimum diameter (w) of penetrating hole (H4) (distance between straight line (Gx) and straight line (Gy)) is set in the range of 30 μm-200 μm, through-hole conductor 143 with low resistance and high connection reliability may be achieved.

In penetrating hole (H4) of the present embodiment, diameter (R1) of first opening (H12) and diameter (R2) of second opening (H22) are set at 150 μm each. Thus, appropriate through-hole conductors may be formed.

Next, as shown in FIGS. 1F and 2C, by patterning electrolytic copper-plated film 142 and copper-foil layers (11, 13), first conductive circuit 144 is formed on first surface 121 of substrate 12, and second conductive circuit 145 is formed on second surface 122. First conductive circuit 144 and second conductive circuit 145 are electrically connected by through-hole conductor 143. By forming conductive circuits on substrate 12, printed wiring board 100 is completed. In the First Embodiment, conductive circuits (144, 145) are made up of a metal layer (copper foil), electroless plated-metal film (electroless copper-plated film 141) and electrolytic plated-metal film (electrolytic copper-plated film 142). Through-hole conductor 143 is made up of electroless plated-metal film (electroless copper-plated film 141) and electrolytic plated-metal film (electrolytic copper-plated film 142).

As shown in FIGS. 1F and 2C, printed wiring board 100 as formed above has the following: insulative substrate 12 having penetrating hole (H4) made up of a first blind hole (H1) formed in first surface 121 side and second blind hole (H2) formed in second surface 122 side opposite first surface 121 which are joined inside substrate 12; conductive circuit 144 formed on first surface 121 of substrate 12; conductive circuit 145 formed on second surface 122 of substrate 12; and through-hole conductor 143 made of copper filled in penetrating hole (H4) and electrically connecting conductive circuit 144 and conductive circuit 145.

As described so far, according to the manufacturing method of the present embodiment, first blind hole (H1) with depth (D1) is formed in first surface 121 side of substrate 12, and second blind hole (H2) with depth (D2) is formed in second surface 122 side. At that time, such holes are formed so that the length obtained by adding depth (D1) and depth (D2) is set to be greater than the thickness of substrate 12. Therefore, even if the position of gravity line (L1) of first blind hole (H1) and the position of gravity line (L2) of second blind hole (H2) are shifted from each other, first blind hole (H1) and second blind hole (H2) are joined together with a sufficiently large inner diameter (minimum diameter (w)) to form penetrating hole (H4). Accordingly, conductive circuit 144 formed on first surface 121 of substrate 12 and conductive circuit 145 formed on second surface 122 are electrically connected with low resistance rates by through-hole conductor 143 filled in penetrating hole (H4).

Moreover, penetrating hole (H4) is formed in an hourglass shape with the diameters small at the center and increasing toward first surface 121 and toward second surface 122. Therefore, when filling penetrating hole (H4) with copper plating, since copper starts depositing at the portion with a small diameter and grows toward the surfaces of substrate 12, voids will seldom form. Accordingly, cracks originating at voids will seldom occur.

Also, since through-hole conductor 143 seldom contains voids, wiring resistance is low, wiring delays may seldom occur and high-frequency signals may be transmitted.

Also, for example, by setting depth (D1) less than half the thickness of substrate 12 and setting depth (D2) greater than half the thickness of substrate 12, the portion where first blind hole (H1) and second blind hole (H2) intersect is formed in first surface 121 side of substrate 12 rather than in the center. Accordingly, at the portion where first blind hole (H1) and second blind hole (H2) intersect, the inner wall of first blind hole (H1) tends not to incline sharply. Thus, even if the positions of first blind hole (H1) and second blind hole (H2) are shifted from each other, they tend to join together. Accordingly, the level of alignment accuracy may be lowered when positioning first blind hole (H1) and second blind hole (H2).

Next, a method for configuring first blind hole (H1) and second blind hole (H2) to be tapered is described in detail.

First, as laser processing equipment, a carbon-dioxide gas laser or UV-YAG (Ultraviolet-Visible-Yttrium-Aluminum-Garnet) laser is used, for example.

Figure 5A:
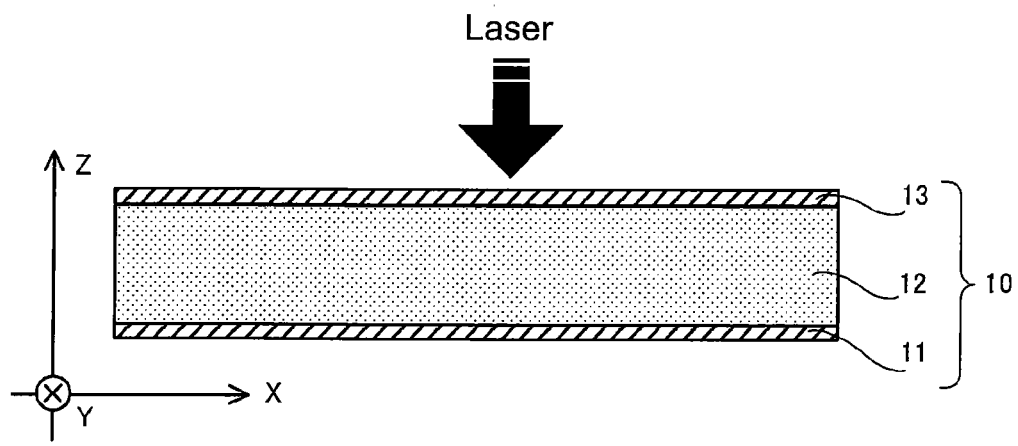
FIG. 5A is a view showing a processing method for directly irradiating a laser at a metal layer.

Next, four examples of the method for irradiating a laser using laser processing equipment are described:

(A) As shown in FIG. 5A, by directly irradiating a laser at a surface of a thin metal layer such as copper foil, first blind hole (H1) and second blind hole (H2) are each formed in a tapered shape. Such a method is called a direct drilling method, described above.

Figure 5B:
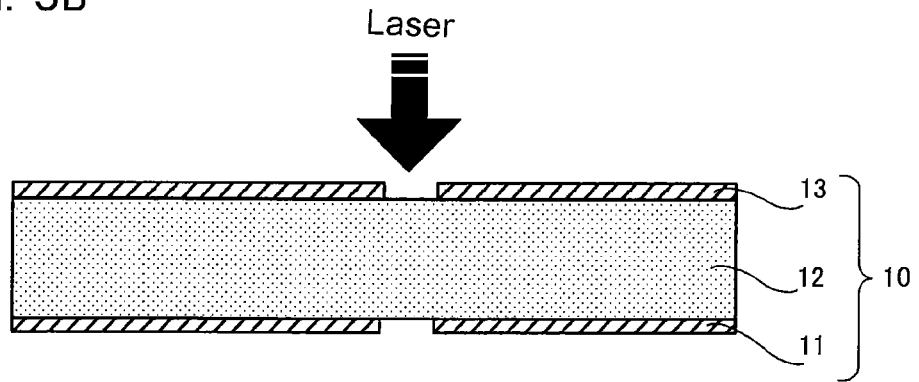
FIG. 5B is a view showing a processing method for forming a blind hole in a metal layer and irradiating a laser at the opening.

(B) As shown in FIG. 5B, copper-clad laminate 10 with exposed substrate 12 is prepared by forming openings in copper-foil layers (11, 13) by etching or the like. Copper-foil layers (11, 13) with openings are called a conformal mask. Next, by irradiating a laser at substrate 12 exposed through openings in copper-foil layers (11, 12), first blind hole (H1)

and second blind hole (H2) are formed in a tapered shape. Such a method is called a conformal mask method.

Figure 5C:
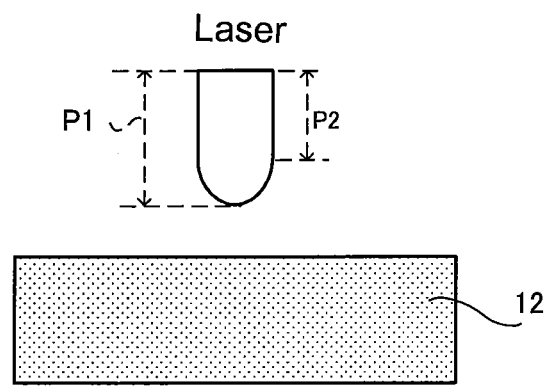
FIG. 5C is a view showing an image of energy intensities of a laser to be irradiated.

(C) Another method is to form first blind hole (H1) and second blind hole (H2) in a tapered shape by irradiating substrate 12 using a laser whose energy is greater in the center than on the periphery. Method (C) may be combined with method (A) or (B). More preferably, blind holes (H1, H2) are formed using a laser with energy that decreases exponentially from the center toward the periphery. In FIG. 5C, energy intensity in one laser pulse is schematically shown by length (P) of the laser. As shown in the drawing, energy (P1) in the center of the laser is stronger than energy (P2) on the periphery, and the energy decreases exponentially from the center toward the periphery.

Figure 5D:
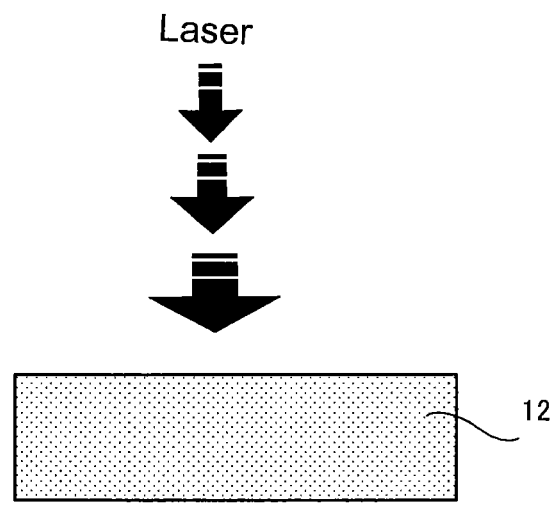
FIG. 5D is a view showing an image of a method for irradiating a pulsed laser multiple times.

(D) As shown in FIG. 5D, yet another method is to form first blind hole (H1) and second blind hole (H2) in a tapered shape by irradiating a pulsed laser multiple times. In such a method, it is preferred that the diameter of the laser be decreased gradually. More preferably, when irradiating the final pulsed laser to form blind holes, a laser that has energy density higher in the center than on the periphery is preferred to be used.

In the above methods (A)-(C), it is preferred to irradiate a laser multiple times to adjust the depth and shape of blind holes (H1, H2) to be formed.

Second Embodiment

In the First Embodiment, regarding condition (3) for forming a penetrating hole, a case was described in which diameter (R1) of first opening (H12) and diameter (R2) of second opening (H22) are the same. In the Second Embodiment, a case is described in which diameter (R1) of first opening (H12) is greater than diameter (R2) of second opening (H22). The rest is the same as in the First Embodiment.

In the present embodiment, by adjusting the irradiation range of laser processing equipment, diameter (R1) of first opening (H12) is formed at 250 μm, and diameter (R12) of second opening (H22) is formed at 200 μm, set to be smaller than diameter (R12) of first opening (H12).

Figure 6A:
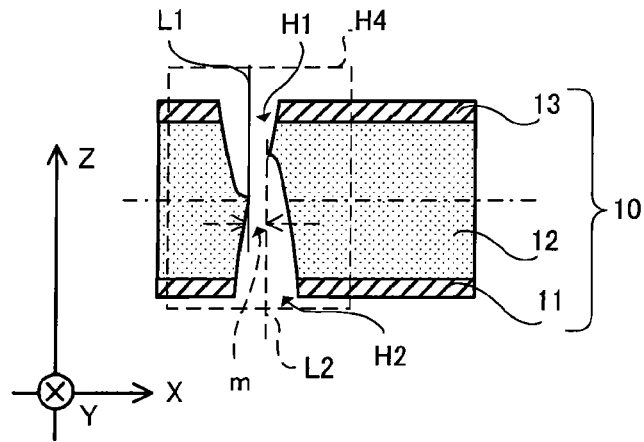
FIGS. 6A-6C are cross-sectional views showing a penetrating hole where the positions of gravity lines are shifted from each other.
Figure 6B:
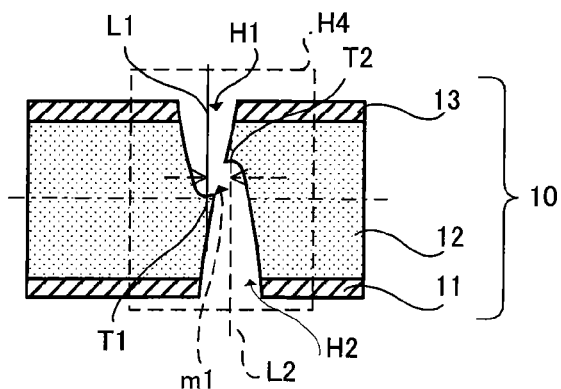
Figure 6C:
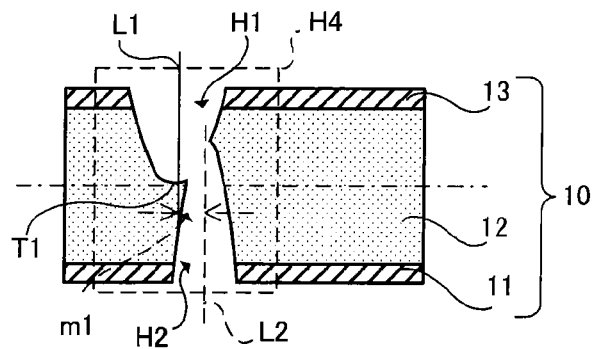

The advantages of penetrating hole (H4) formed according to the present embodiment are described by referring to FIGS. 6A-6C. FIGS. 6A-6C are X-Z cross-sectional views of substrate 12.

As shown in FIG. 6A, even if diameter (R1) of first opening (H12) and diameter (R2) of second opening (H22) are the same, as long as the above conditions (1) and (2) are satisfied, first blind hole (H1) and second blind hole (H2) tend to join together even if gravity line (L1) and gravity line (L2) are shifted from each other (the distance between gravity line (L1) and gravity line (L2) is referred to as shifted amount (m)). Accordingly, penetrating hole (H4) may be formed.

However, if the shift (shifted amount (m1)) becomes larger, as shown in FIG. 6B, vertex (T1) of first blind hole (H1) (the deepest point of the blind hole in an X-Z cross-sectional view) and vertex (T2) of second blind hole (H2) will be left in penetrating hole (H4). In such a case, it is difficult to fill penetrating hole (H4) with copper plating, and voids may tend to occur.

As shown in FIG. 6C, by forming diameter (R1) of first opening (H12) to be larger than diameter (R2) of second opening (H22), even if there is the same shifted amount (m1) as in the case shown in FIG. 6B, the number of vertexes of the blind holes (in FIG. 6C, only vertex (T1) of first blind hole (H1) remains) may be reduced, or may be eliminated. By reducing the number of vertexes remaining inside penetrating hole (H4), it is easier to fill penetrating hole (H4) with plating.

Also, by making depth (D1) of first blind hole (H1) smaller (shallower), diameter (R1) larger, depth (D2) of second blind hole (H2) larger (deeper) and diameter (R2) smaller, it is possible to set the volume of first blind hole (H1) surrounded by the inner wall of first blind hole (H1) and connected surface (H5) substantially the same as the volume of second blind hole (H2) surrounded by the inner wall of second blind hole (H2) and connected surface (H5). By setting the volume of first blind hole (H1) and the volume of second blind hole (H2) substantially the same, the amount of copper plating to be deposited inside first blind hole (H1) and the amount of copper plating to be deposited inside second blind hole (H2) will become the same. Therefore, the thickness of electrolytic copper-plated film 142 formed on first surface of substrate 12 and the thickness of electrolytic copper-plated film 142 formed on second surface 122 may be made substantially the same. Here, above-mentioned connected surface (H5) indicates the surface surrounded by curved lines obtained by connecting portions (G1, G2) where first blind hole (H1) and second blind hole (H2) are connected (see (H5) in FIGS. 12A and 12B).

As described above, in a manufacturing method according to the present embodiment, first blind hole (H1) is formed to have opening (H12) with a larger diameter and tapers from first surface 121 toward second surface 122. By contrast, second blind hole (H2) is formed to have opening (H22) with a smaller diameter and tapers from second surface 122 toward first surface 121. Therefore, first blind hole (H1) and second blind hole (H2) tend to join together inside substrate 12.

Accordingly, when forming first blind hole (H1) and second blind hole (H2), the degree of alignment accuracy may be lowered.

Also, by setting the volume of first blind hole (H1) and the volume of second blind hole (H2) substantially the same, the thickness of electrolytic copper-plated film 142 formed on first surface 121 of substrate 12 and the thickness of electrolytic copper-plated film 142 formed on second surface 122 may be made substantially the same.

Third Embodiment

In the Third Embodiment, a case is described where the degree of decrease in the diameter at the inner wall of first blind hole (H1) is different from the degree of decrease in the diameter at the inner wall of second blind hole (H2), unlike the First Embodiment. Except for the different degrees of decrease in diameters, the rest is the same as in the First Embodiment.

A decrease in the diameter indicates that the inner diameter of a blind hole becomes gradually smaller from the surface toward the bottom. The degree of decrease in the diameter indicates the degree at which the inner diameter becomes smaller. The degree of decrease in the diameter of first blind hole (H1) indicates that the ratio of the inner diameter of first blind hole (H1) to the distance from first surface 121 of substrate 12 toward second surface 122 becomes smaller. The degree of decrease in the diameter of second blind hole (H2) indicates that the ratio of the inner diameter of second blind hole (H2) to the distance from second surface 122 of substrate 12 toward first surface 121 becomes smaller.

Figure 7A:
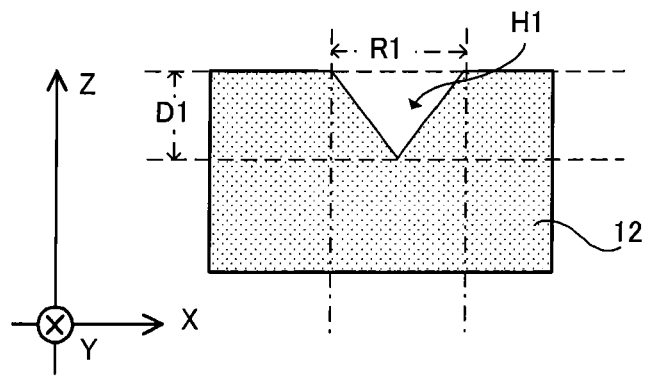
FIG. 7A is a cross-sectional view of a first blind hole according to a reference example of the Third Embodiment of the present invention.
Figure 7B:
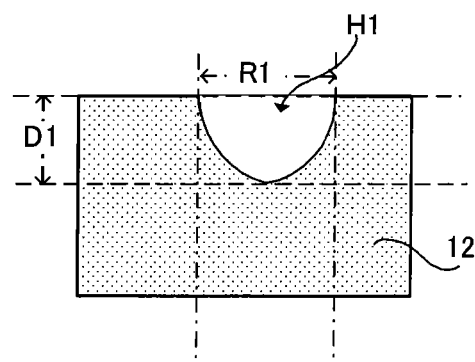
FIG. 7B is a cross-sectional view of a first blind hole with a curved middle portion according to the Third Embodiment.

The advantages of penetrating hole (H4) to be formed according to the present embodiment are described by comparing first blind hole (H1) of a reference example shown in FIG. 7A with first blind hole (H1) of the present embodiment shown in FIG. 7B.

Cross-sectional views shown in FIGS. 7A-7F are X-Z cross-sectional views where a straight line passing through the gravity center of first blind hole (H12) and perpendicular to first surface 121 of substrate 12 is set as axis Z, while a straight line perpendicular to axis Z is set as axis X.

First blind hole (H1) of a reference example formed in first surface 121 side of substrate 12 is cone-shaped. The inner diameter decreases at a constant rate and the degree of decrease in the diameter is constant. As shown in FIG. 7A, its cross section is shaped in an isosceles triangle.

On the other hand, first blind hole (H1) of the present embodiment formed in first surface 121 side of substrate 12 is substantially cone-shaped where the middle section between first opening (H12) and the vertex is curved. The degree of decrease in the diameter of first blind hole (H1) is not constant, and the degree increases from first opening (H12) toward the vertex. As shown in FIG. 7B, its cross section is shaped in substantially an arc where both wall portions are curved toward the outside.

As shown in FIGS. 7A and 7B, even if the respective depths (H1) of first blind hole (H1) and diameters (R1) of first opening (H12) are the same, their cross-sectional shapes are remarkably different due to a difference in the degree of decrease in the diameter between them.

In the present embodiment, diameter (R1) of first opening (H12) is set at 250 μm, and depth (D1) of first blind hole (H1) is set at 0.125 mm.

Figure 8A:
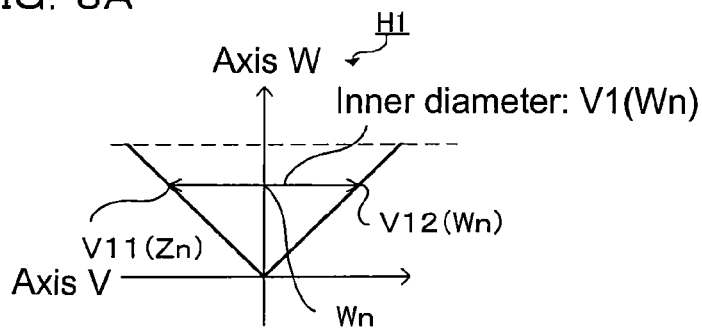
FIG. 8A is a cross-sectional view showing the wall surface (inner wall) of the first blind hole in FIG. 7A.
Figure 8B:
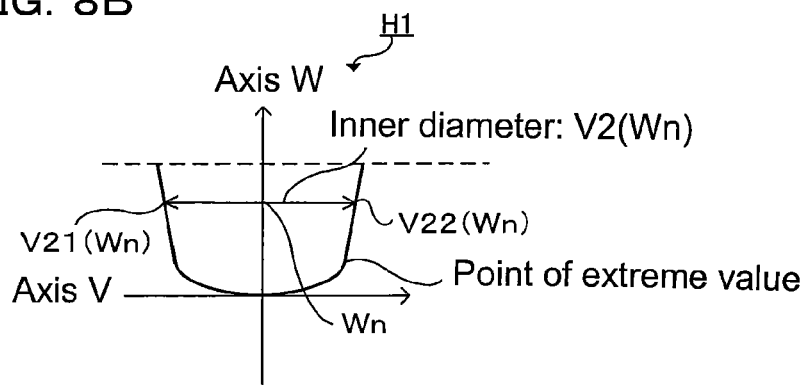
FIG. 8B is a cross-sectional view showing the wall surface (inner wall) of the first blind hole in FIG. 7B.
Figure 8C:
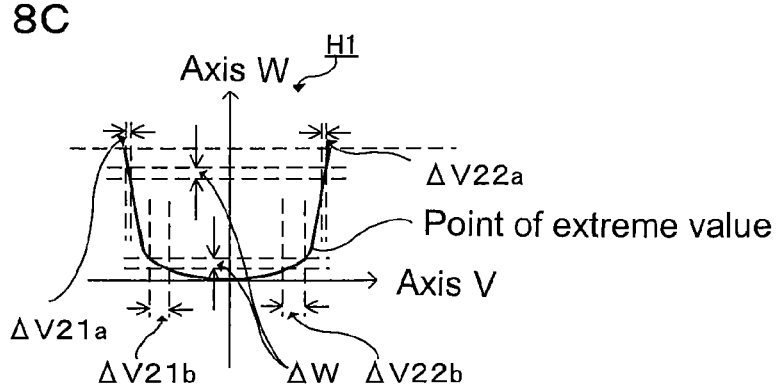
FIG. 8C is a view to describe the degree of decrease in the diameter of the first blind hole in FIG. 7B.

Here, while referring to FIGS. 8A-8C, the degree of decrease in the diameter of blind hole (H1) shown respectively in FIGS. 7A and 7B is described in detail. FIGS. 8A-8C are V-W cross-sectional views.

First, the origin, axis V and axis W in V-W cross-sectional views are described. The vertex of first blind hole (H1) (the deepest point of first blind hole (H1) in an X-Z cross-sectional view) is set as the origin. Then, a straight line passing through the origin and parallel to first surface 121 of substrate 12 is set as axis V, and a straight line passing through the vertex (the origin) of first blind hole (H1) and perpendicular to axis V is set as axis W. Points of intersection where a straight line parallel to axis V intersects the inner wall of first blind hole (H1) shown in FIG. 7A are set as (V11, V12). Also, points of intersection where a straight line parallel to axis V intersects the inner wall of first blind hole (H1) shown in FIG. 7B are set as (V21, V22). Points of intersection (V11, V21) are positioned in the second quadrant and points of intersection (V12, V22) are positioned in the first quadrant. The distances between the points of intersection in the first quadrant and the points of intersection in the second quadrant are set as inner diameters (V1, V2). In addition, the value of the point of intersection is set as (Wn) where a straight line connecting points of intersection (V11) and (V12) or connecting points of intersection (V21) and (V22) and parallel to axis V intersects with axis W. A straight line passing through point (0, Wn) and parallel to axis V is set as straight line (Wn), the inner diameter at value (Wn) is set as V1 (Wn) and V2 (Wn). V1 (Wn) is the inner diameter of first blind hole (H1) shown in FIG. 8A, and V2 (Wn) is the inner diameter of first blind hole (H1) shown in FIG. 8B. In the above, FIG. 7A corresponds to FIG. 8A, and FIG. 7B corresponds to FIG. 8B.

When the value of the W-coordinate changes from 0 (vertex) to (D1) (from the bottom of first blind hole (H1) to first surface 121; here, positive and negative values of depth (D1) of first blind hole (H1) are opposite), the inner diameter (V1) of the blind hole shown in FIG. 8A changes in proportion to the value of the W-coordinate. By contrast, the inner diameter of blind hole (H1) shown in FIG. 8B changes remarkably from 0 (vertex) to the point of extreme value, but the value of the inner diameter does not change much from the point of extreme value to (D1) (first surface 121). The degree of decrease in the diameter at the inner wall causes a bend at the point of extreme value.

FIG. 8C shows FIG. 8B in detail. If straight line (Wn) changes ΔW in the direction of axis W, inner diameter (V2) changes Δ(V2). The ratio of ΔW to ΔV2 (ΔV2/ΔW=(ΔV21+ ΔV22)/ΔW) may be described as the degree of decrease in the diameter. Here, when straight line (Wn) changes ΔW in a direction of axis W, ΔV21 indicates the amount of change in the distance from axis W to point of intersection (V21), and ΔV22 indicates the amount of change in the distance from axis W to point of intersection (V22). Namely, ΔV2 is the absolute value of a value obtained by subtracting the value of inner diameter (V2) after the change (Wn+ΔWn) from the value of inner diameter (V2) before the change (Wn).

When first blind hole (H1) is shaped as shown in FIG. 8C, ΔV2b, which is the degree of change in the inner diameter (V2) from the point of extreme value to the vertex, is greater than ΔV2a, which is the degree of change in the inner diameter (V2) from the surface to the point of extreme value. Namely, in first blind hole (H1) shown in FIG. 7B, the length of the inner diameter (V2) is substantially the same from the surface to the area near the bottom, and the area near the vertex is configured to have an obtuse angle.

Figure 7C:
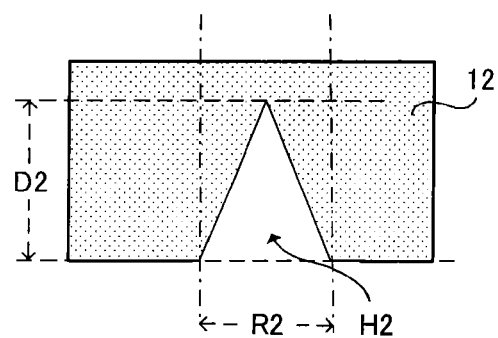
FIG. 7C is a cross-sectional view of a second blind hole according to the Third Embodiment.

Next, compared with first blind hole (H1) configured as above, second blind hole (H2) as shown in FIG. 7C is formed in second surface 122 side to be configured as follows: diameter (R2) is the same as diameter (R1) of first opening (H12), depth (D2) is greater than depth (D1) of first blind hole (H1), and its shape is a circular cone whose cross section is an isosceles triangle. In the present embodiment, second blind hole (H2) is formed to have diameter (R2) of 250 μm and depth (D2) of 0.225 mm.

Figure 7D:
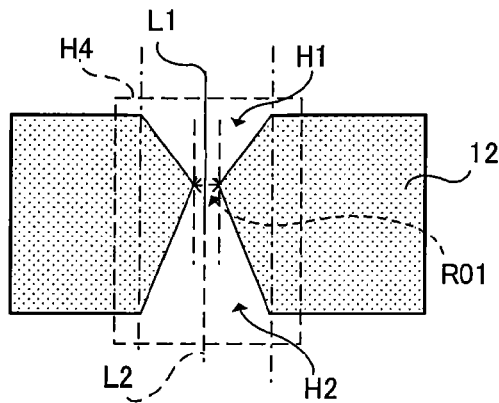
FIG. 7D is a cross-sectional view of a penetrating hole formed using a first blind hole according to the reference example of the Third Embodiment.

FIG. 7D shows penetrating hole (H4) made up of first blind hole (H1) in FIG. 7A and second blind hole (H2) in FIG. 7C. In FIG. 7D, first blind hole (H1) and second blind hole (H2) are cone-shaped, and gravity line (L1) coincides with gravity line (L2). (R01) is the minimum diameter of penetrating hole (H4) in FIG. 7D.

Figure 7E:
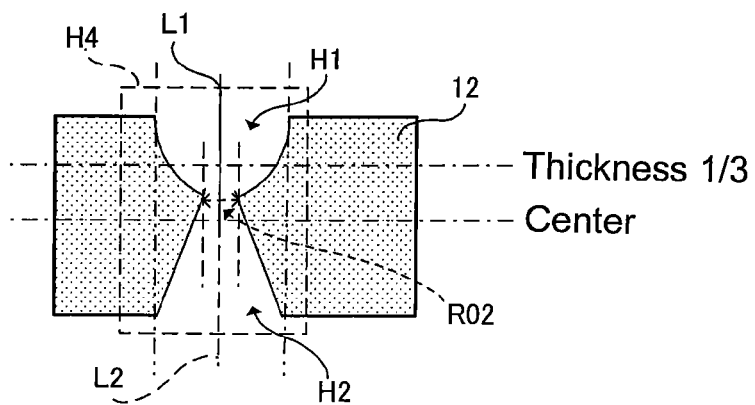
FIG. 7E is a cross-sectional view of a penetrating hole formed using a first blind hole with a curved middle section according to the Third Embodiment.

On the other hand, FIG. 7E shows penetrating hole (H4) made up of first blind hole (H1) in FIG. 7B and second blind hole (H2) in FIG. 7C. In FIG. 7E, first blind hole (H1) is shaped substantially half-spherical, and second blind hole (H2) is cone-shaped. In addition, gravity line (L1) of first opening (H12) coincides with gravity line (L2) of second opening (H22). At that time, (R02) is the minimum diameter of penetrating hole (H4) in FIG. 7E.

In such a case, as shown in FIG. 7B, the inner diameter of first blind hole (H1) from first surface 121 to the bottom area (near the vertex) is a size close to diameter (R1) of first opening (H12). By contrast, the inner diameter of first blind hole (H1) shown in FIG. 7A decreases in size at a constant rate from first surface 121 toward the vertex. Therefore, the amount (volume) of second blind hole (H2) inserted into first blind hole (H1) differs when a shape of the inner wall in the cross section of first blind hole (H1) changes exponentially from the vertex toward first surface 121 of substrate 12 (a case shown in FIG. 7B), and when the shape changes in a straight line (a case shown in FIG. 7A). The former has a greater inserted amount (volume) than the latter.

Figure 7F:
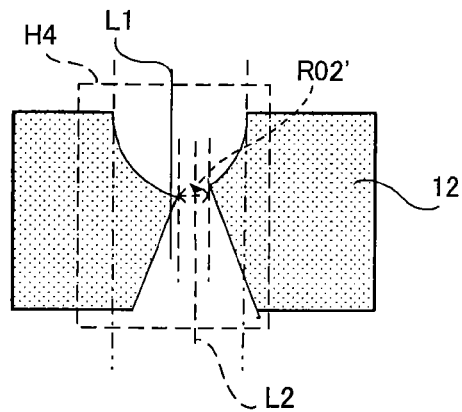
FIG. 7F is a cross-sectional view of a penetrating hole with gravity lines shifted from each other according to the Third Embodiment.

Namely, minimum diameter (R02) is greater than minimum diameter (R01). Thus, through-hole conductor 143 filled in penetrating hole (H4) having first blind hole (H1) shown in FIG. 7B tends to have low resistance, compared with through-hole conductor 143 filled in penetrating hole (H4) having first blind hole (H1) of a comparative example shown in FIG. 7A. In addition, as shown in FIG. 7F, even if gravity line (L1) and gravity line (L2) are shifted from each other, minimum diameter (R02') may be set at the same size as minimum diameter (R02) in a case in which gravity center (L1) coincides with gravity center (L2).

Also, since penetrating hole (H4) shown in FIG. 7E has a larger volume than penetrating hole (H4) shown in FIG. 7D, the amount of metal contained in through-hole conductor 143 is greater, and the connection reliability is higher.

Furthermore, the volume of first blind hole (H1) and the volume of second blind hole (H2) may be set substantially the same. Thus, when electrolytic copper-plated film is deposited on first surface 121 and second surface 122 of substrate 12, the thickness of electrolytic copper-plated films 142 may be made substantially the same.

The portion where first blind hole (H1) and second blind hole (H2) of penetrating hole (H4) shown in FIG. 7E intersect is preferred to be positioned between the center of substrate 12 and first surface 121. The center of substrate 12 indicates a straight line passing through the area at half the thickness of substrate 12 and parallel to first surface 121.

Moreover, the portion where first blind hole (H1) and second blind hole (H2) intersect is preferred to be set deeper than ⅓ of the thickness of substrate 12 measured from first surface 121, and positioned closer to first surface 121 than to the center of substrate 12. In addition, minimum diameter (R02) is preferred to be set at ⅔ or more, but 9/10 or less, of diameter (R1) of first opening (H12). In through-hole conductor 143 formed in penetrating hole (H4) satisfying such conditions, connection reliability becomes higher against warping in substrate 12.

Next, a method for irradiating a laser to form penetrating hole (H4) is described.

First blind hole (H1) shown in FIGS. 7B and 8B, where the length of inner diameter (V2) from the surface to the vertex is substantially the same and the angle at the vertex is obtuse, may be formed using a laser such as shown in FIG. 5C, for example, whose energy decreases exponentially from the center of the opening toward the periphery.

Also, blind holes are formed by beaming multiple pulses, in which the laser energy and the irradiation range are adjusted for each pulse. At that time, for each pulsed laser, it is preferred to use a laser whose energy decreases exponentially from the center toward the periphery.

As described so far, the minimum diameter of penetrating hole (H4) may be enlarged by forming first blind hole (H1) with a diameter whose degree of decrease is not constant but changes gradually from the surface to a predetermined depth (the point of extreme value), and changes markedly after passing the predetermined depth. Also, the portion (the point of extreme value) where first blind hole (H1) and second blind hole (H2) intersect is preferred to be positioned deeper than one third of the thickness of substrate 12, but shallower than the center of substrate 12 measured from first surface 121. With such a structure, when through-hole conductor 143 is formed by filling metal in penetrating hole (H4), lower resistance rates and higher reliability may be achieved.

In addition, by setting the volume of first blind hole (H1) substantially the same as that of second blind hole (H2), when depositing electrolytic copper-plated film 142 on first surface 121 and second surface 122 of substrate 12, the thickness of electrolytic copper-plated films 142 may be made substantially the same.

Fourth Embodiment

Figure 9A:
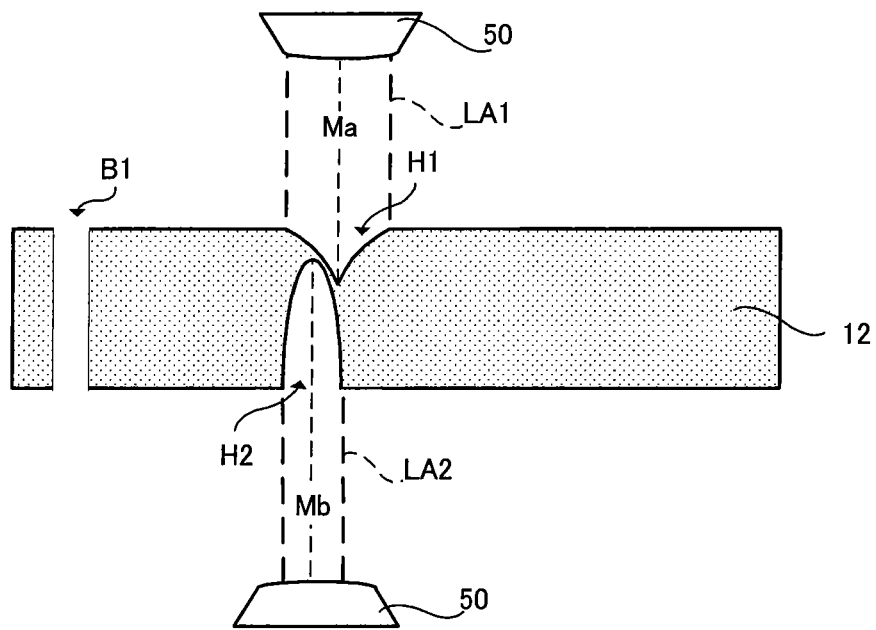
FIG. 9A is a cross-sectional view showing an example where a first blind hole and a second blind hole are not joined.
Figure 9B:
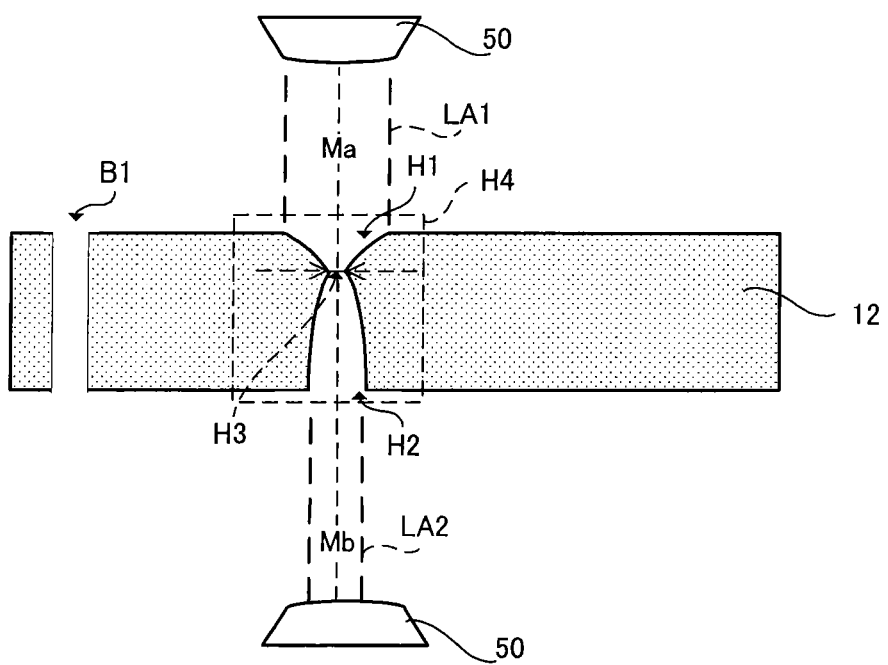
FIG. 9B is a cross-sectional view showing an example where the joined portion of a first blind hole and a second blind hole is small.

Even if the respective opening diameters and depths are the same, when the inner walls of blind holes incline at acute angles, there may be cases in which a penetrating hole will not be formed. For example, when the inclination angle of the inner wall of first blind hole (H1) is acute, as shown in FIGS. 9A and 9B, and if gravity line (Mb) of a laser to form second blind hole (H2) is shifted slightly from gravity line (Ma) of a laser to form first blind hole (H1), problems may possibly arise such as difficulty in connecting first blind hole (H1) and second blind hole (H2), or an abnormally small diameter of joined portion (H3). In such cases, there is a concern that expected characteristics may not be achieved. Here, gravity line (Ma) indicates a straight line passing through the gravity center of the laser irradiation range to form first blind hole (H1) and perpendicular to first surface 121 of substrate 12; and gravity line (Mb) indicates a straight line passing through the gravity center of the laser irradiation range to form second blind hole (H2) and perpendicular to second surface 122 of substrate 12. Also, depending on the energy density or the shape of irradiation ranges of a laser to be used, gravity lines (Ma, Mb) of laser irradiation ranges coincide with gravity lines (L1, L2) of the openings in some cases.

Therefore, the inner wall of first blind hole (H1) is preferred to incline relatively little (obtuse in the area near the vertex of first blind hole (H1)), and the inner wall of second blind hole (H2) inserted into first blind hole (H1) is preferred to incline greatly (acute in the area near the vertex of second blind hole (H2)).

In the Fourth Embodiment, the same as in the Third Embodiment, first blind hole (H1) and second blind hole (H2) are shaped differently.

The conditions for forming penetrating hole (H4) are described using FIGS. 10A-10F. FIGS. 10A-10F are X-Z cross-sectional views of substrate 12. In such X-Z cross sections, a straight line perpendicular to first surface 121 is set as axis Z, and a straight line parallel to first surface 121 is set as axis X.

Figure 10A:
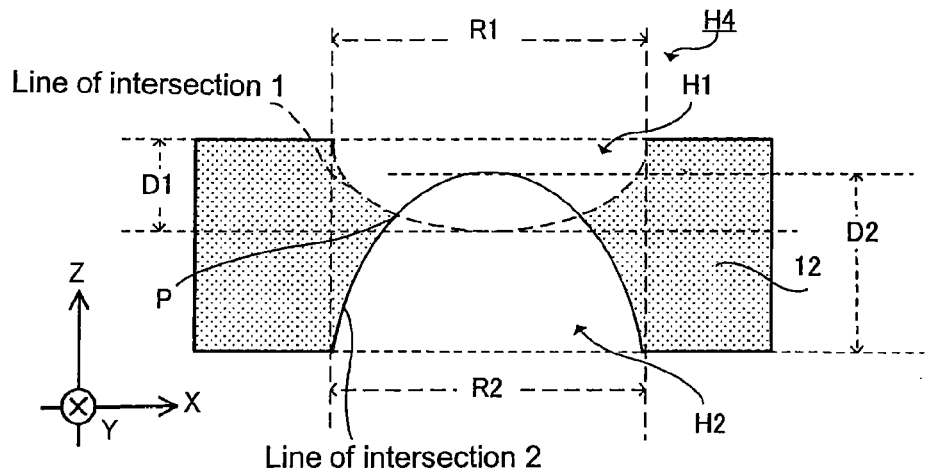
FIG. 10A is a view showing a point of intersection where a first blind hole and a second blind hole intersect according to the Fourth Embodiment of the present invention.
Figure 10B:
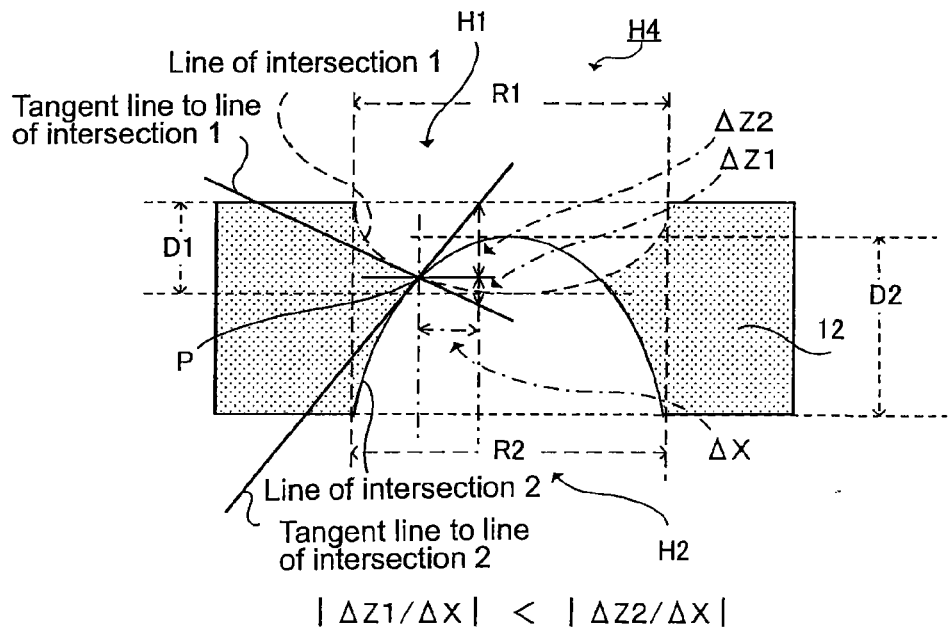
FIG. 10B is a view showing the degree of inclination of tangent lines at the point of intersection according to the Fourth Embodiment.

In FIGS. 10A and 10B, the thickness of substrate 12 is set at 0.2 mm, diameter (R1) of first opening (H12) and diameter (R2) of second opening (H22) are the same (diameter R1=diameter R2), and depth (D1) of first blind hole (H1) is less (shallower) than depth (D2) of second blind hole (H2). More specifically, diameter (R1) and diameter (R2) are set at 150 μm, depth (D1) at 0.08 mm, and depth (D2) at 0.180 mm.

As shown in FIG. 10A, a curved line obtained by slicing the inner wall (side wall) of first blind hole (H1) with an X-Z plane is set as line of intersection 1, a curved line obtained by slicing the inner wall (side wall) of second blind hole (H2) with an X-Z plane is set as line of intersection 2, the point where line of intersection 1 and line of intersection 2 intersect is set as point of intersection (P). Point of intersection (P) is the point where the inner wall of first blind hole (H1) intersects the inner wall of second blind hole (H2). As shown in FIG. 10B, at point of intersection (P), the degree of inclination of a tangent line to line of intersection 1 (absolute value of the inclination $|\Delta Z1/\Delta X|$) and the degree of inclination of a tangent line to intersection 2 (absolute value of the inclination $|\Delta Z2/\Delta X|$) satisfy the following formula:

(4) the degree of inclination of a tangent line to line of intersection 1 ($|\Delta Z1/\Delta X|$) < the degree of inclination of a tangent line to line of intersection 2 ($|Z2/\Delta X|$)

The advantages of penetrating hole (H4) formed with first blind hole (H1) and second blind hole (H2) which satisfy condition (4) in addition to conditions (1)-(3) shown in the First Embodiment are described in the following.

Figure 10C:
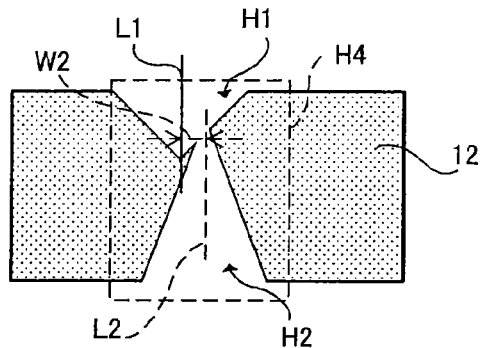
FIG. 10C is a view showing a penetrating hole formed using a first blind hole whose wall surface inclines linearly according to the Fourth Embodiment.
Figure 10D:
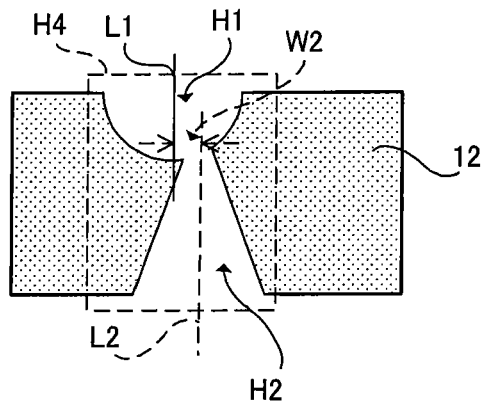
FIG. 10D is a view showing a penetrating hole formed using a first blind hole whose wall surface inclines gradually according to the Fourth Embodiment.

The same as in the Third Embodiment, in FIGS. 10C and 10D, when gravity line (L1) and gravity line (L2) are shifted from each other with an offset distance (w2) (shifted amount), the minimum diameter is greater in FIG. 10D which satisfies condition (4), compared with FIG. 10C.

Figure 10E:
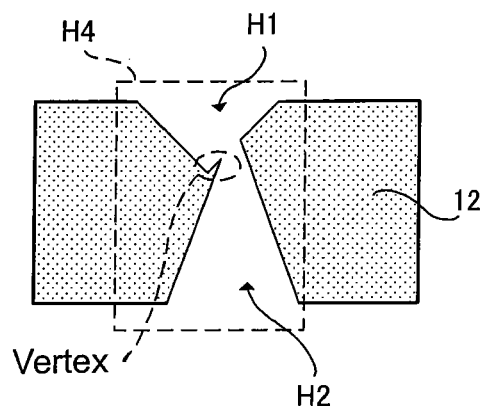
FIG. 10E is a view showing there is a protruding portion in a penetrating hole of the Fourth Embodiment.
Figure 10F:
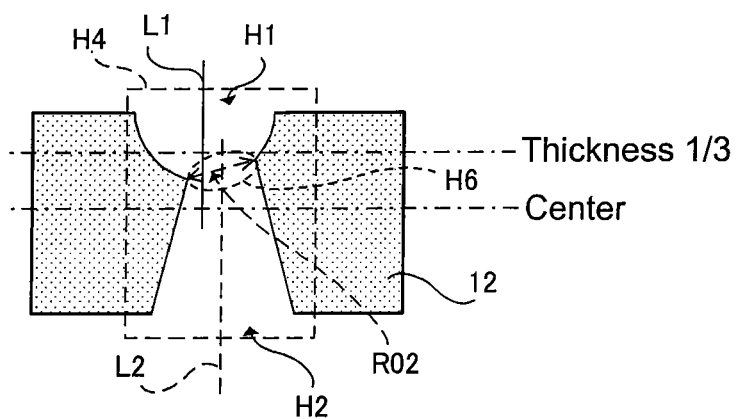
FIG. 10F is a view showing there is no protruding portion in a penetrating hole of the Fourth Embodiment.

When condition (4) is not satisfied, as shown in FIG. 10E, in the portion surrounded by the left-side wall surface of first blind hole (H1) and the left-side wall surface of second blind hole (H2), the insulation layer (the resin in the portion surrounded by a broken line in the drawing and protruding into penetrating hole (H4)) is not removed by a laser and protrudes into penetrating hole (H4). On the other hand, if condition (4) is satisfied, as shown in FIG. 10F, there is no insulation layer remaining in the portion surrounded by the left-side wall surface of first blind hole (H1) and the left-side wall surface of second blind hole (H2), and thus no portion is formed to protrude into penetrating hole (H4).

If through-hole conductor 143 is formed by filling plating in penetrating hole (H4) having a resin portion protruding into penetrating hole (H4), cracks tend to occur in substrate 12. However, in penetrating hole (H4) which satisfies condition (4), a resin portion protruding into penetrating hole (H4) is seldom formed, and cracks seldom occur in substrate 12.

In penetrating hole (H4) satisfying conditions (1)-(4), the portion (connected portion (H6)) where first blind hole (H1) and second blind hole (H2) intersect is preferred to be positioned between the center of substrate 12 and first surface 121. More preferably, the portion where first blind hole (H1) and second blind hole (H2) intersect is preferred to be positioned deeper than ⅓ of the thickness of substrate 12 measured from first surface 121, but shallower than the center of substrate 12. Also, minimum diameter (R02) is preferred to be set ⅔ or more, but 9/10 or less, of diameter (R1) of first opening (H12). If through-hole conductor 143 is formed in such penetrating hole (H4), cracks seldom occur in through-hole conductor 143 and substrate 12 when substrate 12 is warped. In addition, peeling seldom occurs between through-hole conductor 143 and substrate 12.

Moreover, to form penetrating hole (H4) which satisfies conditions (1)-(4), when forming first blind hole (H1), it is preferred to use a laser whose energy decreases exponentially from the gravity center of the laser irradiation range toward the periphery; and when forming second blind hole (H2), it is preferred to use a laser whose energy decreases linearly from the gravity center of the laser irradiation range toward the periphery.

As described so far, by forming penetrating hole (H4) which satisfies conditions (1)-(4), even if gravity line (L1) and gravity line (L2) are shifted from each other, a resin portion protruding into penetrating hole (H4) is seldom formed. Thus, it is easier to fill plating in penetrating hole (H4). When through-hole conductor 143 is formed by filling penetrating hole (H4) with metal, cracks seldom occur. Also, when filling metal in penetrating hole (H4), plating will be deposited uniformly from the portion of the minimum diameter toward first surface 121 and second surface 122. Thus, without depositing an unnecessary amount of copper on first surface 121 and second surface 122, conductive circuit (144, 145) may be formed. Accordingly, the thickness of conductive circuits (144, 145) formed on first surface 121 and second surface 122 of substrate 12 may be made thinner.

Furthermore, the volume of first blind hole (H1) which is surrounded by first opening (H12), the inner wall of first blind hole (H1) and connected surface (H5) may be made substantially the same as the volume of second blind hole (H2) which is surrounded by second opening (H22), the inner wall of second blind hole (H2) and connected surface (H5). Thus, the thicknesses of electrolytic copper-plated films 142 deposited on the upper and lower surfaces of substrate 12 may tend to become the same.

Fifth Embodiment

In the First Embodiment, penetrating hole (H4) is formed by forming both blind holes in such a way that gravity line (Ma) of a laser to form first blind hole (H1) coincides with gravity line (Mb) of a laser to form second blind hole (H2). By contrast, in the Fifth Embodiment, blind holes are formed where gravity line (Ma) and gravity line (Mb) are set apart (offset) at a predetermined distance. In the present embodiment, a method for forming penetrating hole (H4) is described where gravity line (L1) of first opening (H12) does not coincide with gravity line (L2) of second opening (H22), as shown in FIG. 6A. In the present embodiment, substrate 12 (insulative substrate) is the starting material.

First, base holes (B1, B2, B3, B4) are formed in substrate 12 and set as alignment marks. Then, the same as in the First Embodiment, X-Y coordinates are set on first surface 121 of substrate 12 based on the alignment marks.

Next, to form first blind hole (H1) on first surface 121 of substrate 12, the coordinates are set for irradiating a laser. For example, the coordinates for gravity line (Ma) of the irradiation range are set as (X1, Y1)=(100, 100).

First blind hole (H1) is formed the same as in the First Embodiment, and substrate 12 is inverted.

Next, X-Y coordinates are set on second surface 122 of substrate 12 based on the alignment marks. The X-Y axes on second surface 122 are axes obtained by projecting the X-Y axes of first surface 121 onto second surface 122 with equal magnification.

Next, to form second blind hole (H2) on second surface 122 of substrate 12, the coordinates are set for irradiating a laser. For example, the coordinates for gravity line (Mb) of the irradiation range are set as (X2, Y2)=(100, 105). In such a case, the coordinates for the gravity center of second opening (H22) are set 5 μm away from the coordinates for the gravity center of first opening (H12) in the direction of axis Y.

After that, penetrating hole (H4) is formed by forming second blind hole (H2) the same as in the First Embodiment.

As described above, by positioning the point (coordinates) for irradiating a laser to form a first blind hole (H1) different from the point (coordinates) for irradiating a laser to form a second blind hole (H2), penetrating hole (H4) may be formed where gravity line (L1) of first opening (H12) does not coincide with gravity line (L2) of second opening (H22).

As described above, by forming penetrating hole (H4) where gravity line (L1) of first opening (H12) and gravity line (L2) of second opening (H22) are shifted from each other, when penetrating hole (H4) cannot be formed on the same coordinates due to wiring distributions for conductive circuit 144 formed on first surface 121 and conductive circuit 145 formed on second surface 122, or when penetrating hole (H4) cannot be formed using the same coordinates due to large wiring regions, penetrating hole (H4) may still be formed.

Also, by offsetting gravity line (L1) from gravity line (L2), connected surface (H5) tends not to be parallel to first surface 121 and second surface 122 of substrate 12. Namely, connected surface (H5) is angled to first surface 121 and second surface 122 of substrate 12. Because of connected surface (H5) being inclined to first surface 121 and second surface 122 of substrate 12, connection reliability against warping in substrate 12 is enhanced in through-hole conductor 143.

Sixth Embodiment

In the Second Embodiment, gravity line (Ma) of the laser irradiation range to form first blind hole (H1) coincides with gravity line (Mb) of the laser irradiation range to form second blind hole (H2). Moreover, penetrating hole (H4) is formed by forming blind holes to satisfy conditions (1)-(3).

By contrast, in the Sixth Embodiment, the same as in the Fifth Embodiment, gravity line (Ma) of a laser irradiation range and gravity line (Mb) of a laser irradiation range are set apart at a predetermined distance. Therefore, in penetrating hole (H4) of the present embodiment, gravity line (L1) of first opening (H12) and gravity line (L2) of second opening (H22) are offset from each other as shown in FIG. 6C.

As described above, in the present embodiment, even if the position to form first blind hole (H1) and the position to form second blind hole (H2) are shifted from each other, it is easier to form penetrating hole (H4).

Seventh Embodiment

In the Third Embodiment, gravity line (Ma) of the laser irradiation range to form first blind hole (H1) coincides with gravity line (Mb) of the laser irradiation range to form second blind hole (H2). Moreover, first blind hole (H1) is formed in such a way that the degree of change is small in the inner diameter from first surface 121 to the point of extreme value, but the degree of change is great in the inner diameter from the point of extreme value to the bottom (vertex).

By contrast, in the Seventh Embodiment, the same as in the Fifth Embodiment, gravity line (Ma) of a laser irradiation range and gravity line (Mb) of another laser irradiation range are set apart at a predetermined distance. Accordingly, in penetrating hole (H4) of the present embodiment, gravity line (L1) of first opening (H12) and gravity line (L2) of second opening (H22) are offset as shown in FIG. 7F.

As described above, in the present embodiment, even if the position to form first blind hole (H1) and the position to form second blind hole (H2) are shifted from each other, it is easier to form penetrating hole (H4).

Eighth Embodiment

In the Fourth Embodiment, gravity line (Ma) of the laser irradiation range to form first blind hole (H1) coincides with gravity line (Mb) of the laser irradiation range to form second blind hole (H2). Moreover, penetrating hole (H4) is formed by forming blind holes to satisfy conditions (1)-(4).

By contrast, in the Eighth Embodiment, the same as in the Fifth Embodiment, gravity line (Ma) of a laser irradiation range and gravity line (Mb) of the other laser irradiation range are set apart at a predetermined distance. Accordingly, in penetrating hole (H4) of the present embodiment, gravity line (L1) of first opening (H12) and gravity line (L2) of second opening (H22) are offset as shown in FIG. 10F.

To enhance reliability in through-hole conductor 143 which connects conductive circuit 144 and conductive circuit 145 formed on substrate 12, the offset amount (distance between gravity line (L1) and gravity line (L2)) is preferred to be set 50% or less than diameter (R1) of first opening (H12).

Figure 11A:
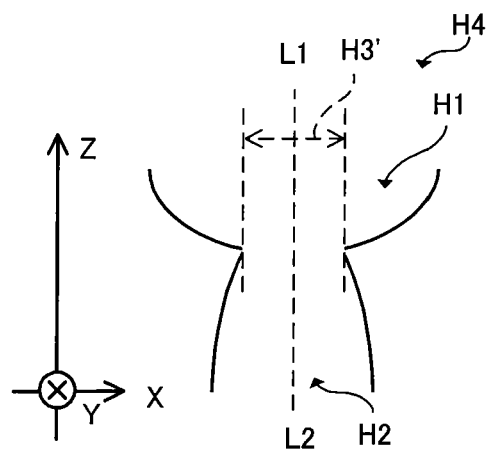
FIG. 11A is a view showing a joined portion in a case where gravity lines coincide with each other according to the Eighth Embodiment of the present invention.
Figure 11B:
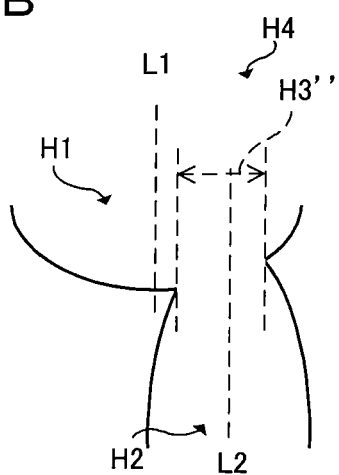
FIG. 11B is a view showing a joined portion in a case where gravity lines do not coincide with each other according to the Eighth Embodiment.

As shown in FIG. 11A, when penetrating hole (H4) is perfectly formed, and gravity line (L1) coincides with gravity line (L2), the opening diameter of joined portion (H3) (minimum diameter: H3') becomes larger. On the other hand, when penetrating hole (H4) is not formed perfectly and gravity line (L1) does not coincide with gravity line (L2), as shown in FIG. 11B, the opening diameter of joined portion (H3) (minimum diameter: H3") becomes smaller than in a case when gravity line (L1) coincides with gravity line (L2).

However, even if the distance between gravity line (L1) and gravity line (L2) is larger, since the portion of second blind hole (H2) that is inserted into first blind hole (H1) is large in the present embodiment, the size of the opening diameter of joined portion (H3) is large enough to make a connection. Accordingly, even if the position to form first blind hole (H1) and the position to form second blind hole (H2) are shifted from each other, first blind hole (H1) and second blind hole (H2) may be joined, and penetrating hole (H4) is formed to show expected characteristics.

According to the present embodiment, the minimum diameter of penetrating hole (H4) may be made larger in penetrating hole (H4) where gravity line (L1) does not coincide with gravity line (L2), the same as in penetrating hole (H4) where gravity line (L1) coincides with gravity line (L2). Therefore, resistance in through-hole conductor 143 may be reduced. Also, even when the offset amount between gravity line (L1) and gravity line (L2) is different in each penetrating hole (H4), it may be easier to prevent resistance values from fluctuating in each through-hole conductor 143 to be formed.

Figure 12A:
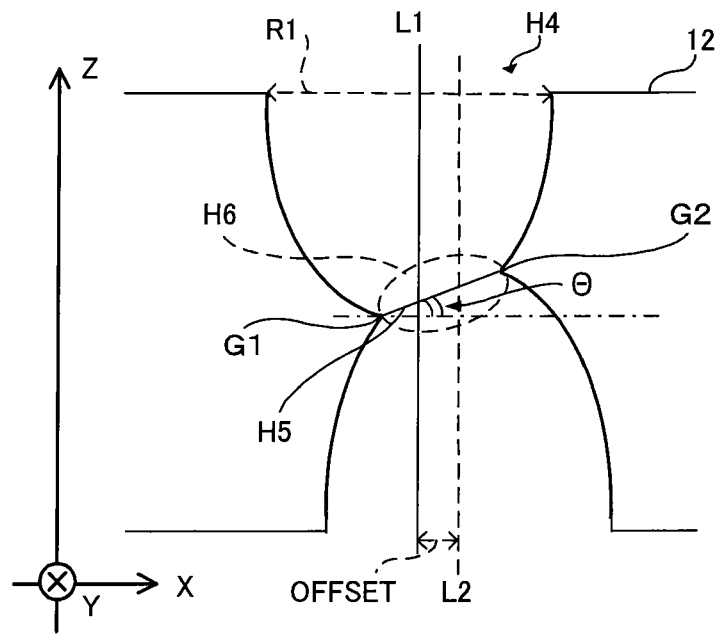
FIG. 12A is a cross-sectional view showing a penetrating hole in which the connected portion of a first blind hole and a second blind hole is inclined according to the Eighth Embodiment.
Figure 12B:
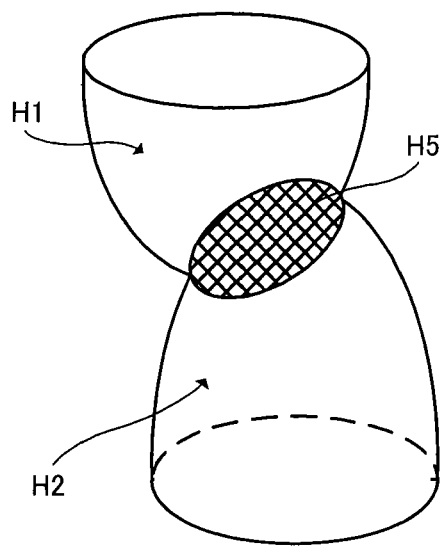
FIG. 12B is a view showing a penetrating hole in which the connected portion of a first blind hole and a second blind hole is inclined according to the Eighth Embodiment.

The offset amount (distance between gravity line (L1) and gravity line (L2)) is preferred to be 5% or more, but 30% or less, of diameter (R1) of first opening (H12). As shown in FIGS. 12A and 12B, connected surface (H5) where first blind hole (H1) and second blind hole (H2) are connected is inclined to first surface 121 and second surface 122 of substrate 12, and angle (θ) between connected surface (H5) and first surface 121 and second surface 122 tends to become smaller.

FIG. 12A is an X-Z cross section of FIG. 12B. Angle (θ) is the angle of connected surface (H5) against first surface 121 in an X-Z cross-sectional view.

If connected surface (H5) of through-hole conductor 143 is inclined to the surfaces (first surface 121 and second surface 122) of substrate 12, when warping occurs in printed wiring board 100, stresses exerted on the connected portion (the portion where first blind hole (H1) and second blind hole (H2) are connected) of through-hole conductor 143 tend to be dispersed. Accordingly, cracks seldom occur in through-hole conductor 143 and printed wiring board 100, and peeling between through-hole conductor 143 and substrate 12 may be effectively prevented.

Furthermore, if angle (θ) is small, even if substrate 12 expands in the directions of axis Z, it is easier to maintain high connection reliability in through-hole conductor 143. Thus, angle (θ) is preferred to be 5 degrees or more, but 40 degrees or less. In addition, if angle (θ) is 10 degrees or more, but 30 degrees or less, long-term reliability is improved.

As described so far, by forming penetrating hole (H4) to satisfy conditions (1)-(4), penetrating hole (H4) may be formed normally even when alignment accuracy is low.

Also, by forming penetrating hole (H4) in such a way that gravity line (L1) of first opening (H12) and gravity line (L2) of second opening (H22) are offset (do not coincide) and connected surface (H5) is inclined, cracks seldom occur and peeling may be prevented from occurring between through-hole conductor 143 and printed wiring board 100. Namely, even when warping tends to occur in printed wiring board 100, reliability may be enhanced in through-hole conductor 143.

Example

Built-up printed wiring board 200 is formed by using above printed wiring board 100 as core substrate 20 of a multilayer wiring board and further laminating insulation layers on core substrate 20.

In the present applied example, forming built-up layers on both surfaces of core substrate 20 is described. Such built-up layers are made up of interlayer resin insulation layers (21, 22), conductive circuits (148, 149) and via conductors (H6).

First, as shown in FIG. 13A, the structure and manufacturing method of core substrate 20 are basically the same as the structure and manufacturing method of above-described printed wiring board 100. However, for the core of a built-up printed board, materials are prepared to satisfy the following conditions required for the steps to form upper-layer portions: strength capable of supporting built-up layers and components, heat resistance, appropriate thermal expansion coefficients, dimensional stability and resistance against warping or twisting which are required to form upper-layer portions.

Next, insulative film (such as ABF series made by Ajinomoto Fine-Techno Co., Inc.) is laminated on both surfaces of core substrate 20, and interlayer resin insulation layers are formed by thermosetting such insulative film.

Then, both surfaces of interlayer resin insulation layers are irradiated with a laser to form blind holes for via conductors (H6) which reach from the surfaces of interlayer resin insulation layers to conductive circuits (144, 145) on core substrate 20 or through-hole conductor 143.

Next, electroless copper-plated film 141 is formed on the inner wall of blind holes and interlayer resin insulation layers. Then, plating resist is formed on electroless copper-plated film 141 to protect the portions on which plating will not be performed. Then, electrolytic copper-plated film 142 is formed on exposed portions of electroless copper-plated film 141 which are not covered by plating resist. After that, the plating resist is removed.

Figure 13C:
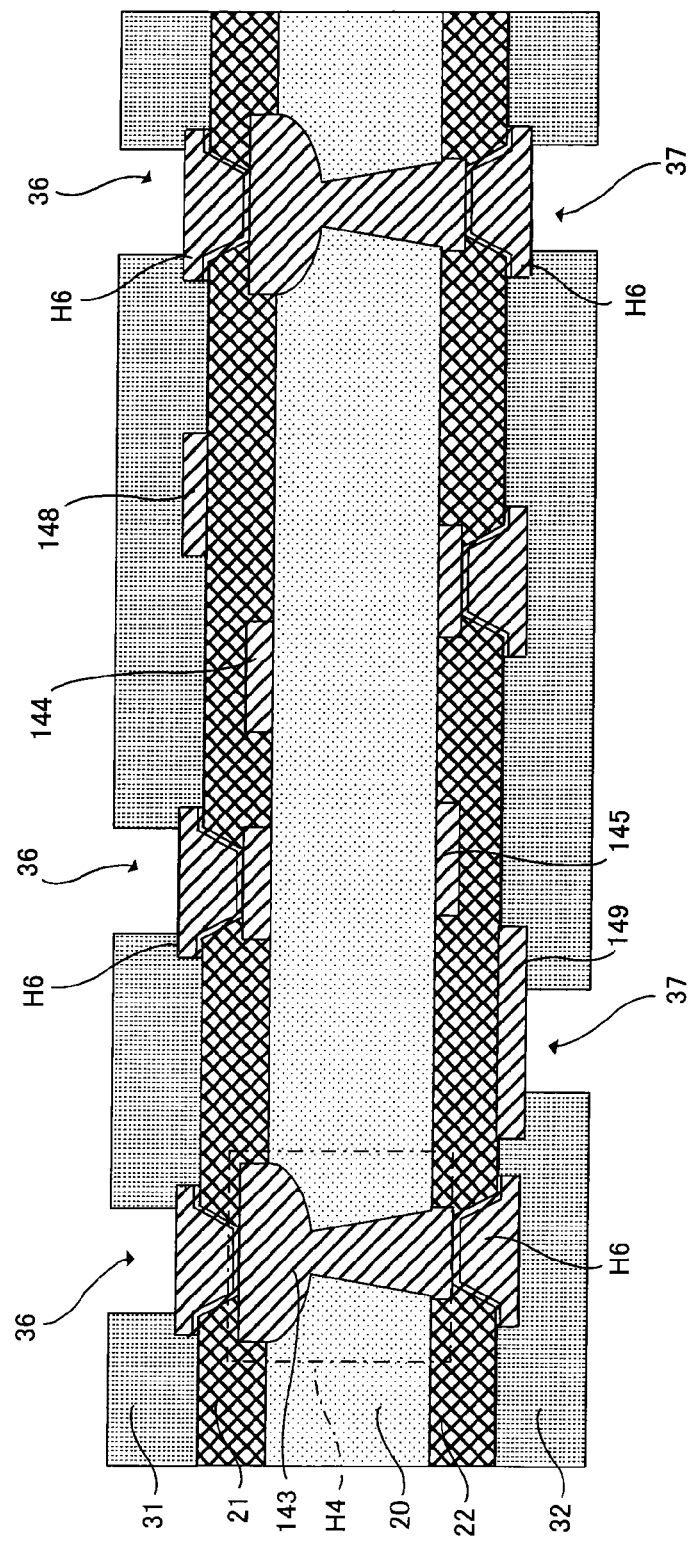
Figure 14A:
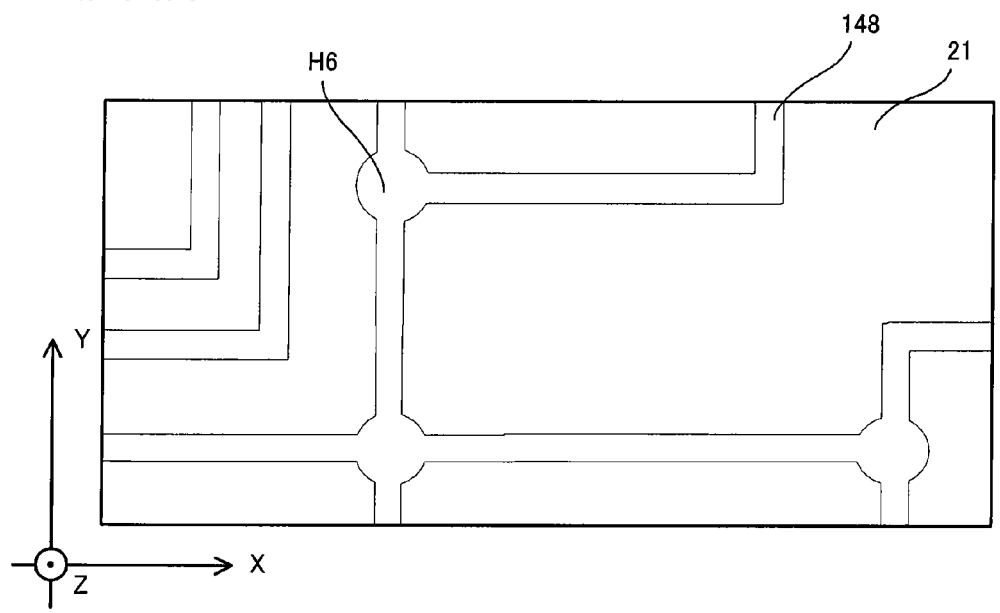
FIG. 14A is a plan view of a multilayer board where penetrating holes are formed in the core substrate of the applied example.

Moreover, by removing electroless copper-plated film 141 positioned between portions of electrolytic copper-plated film 142 on interlayer resin insulation layers, conductive circuits (148, 149) and via conductors (H6) made up of electroless copper-plated film 141 and electrolytic copper-plated film 142 on such film are formed as shown in FIG. 13B and FIG. 14A. Such via conductors (H6) are preferred to be through-hole conductors made of plating filled in blind holes formed in interlayer resin insulation layers.

By means of via conductors (H6), conductive circuits (144, 145) or through-hole conductor 143 of core substrate 20 are electrically connected to conductive circuits (148, 149) on interlayer resin insulation layers.

Next, by repeating each step, from a step to form interlayer resin insulation layers (21, 22) to a patterning step, the same number of times as the number of layers to be laminated, a multilayer board is formed.

Next, as shown in FIG. 13C, on both surfaces of the multilayer board, solder-resist layers (31, 32) are formed which have blind holes (36, 37) to expose part of conductive circuits (148, 149) or via conductors (H6). Blind holes (36, 37) formed in solder-resist layers (31, 32) may expose part of the upper surfaces of via conductors (H6), or may expose the entire surfaces of via conductors (H6) as well as parts of conductive circuits (148, 149) electrically connected to via conductors (H6).

Figure 13D:
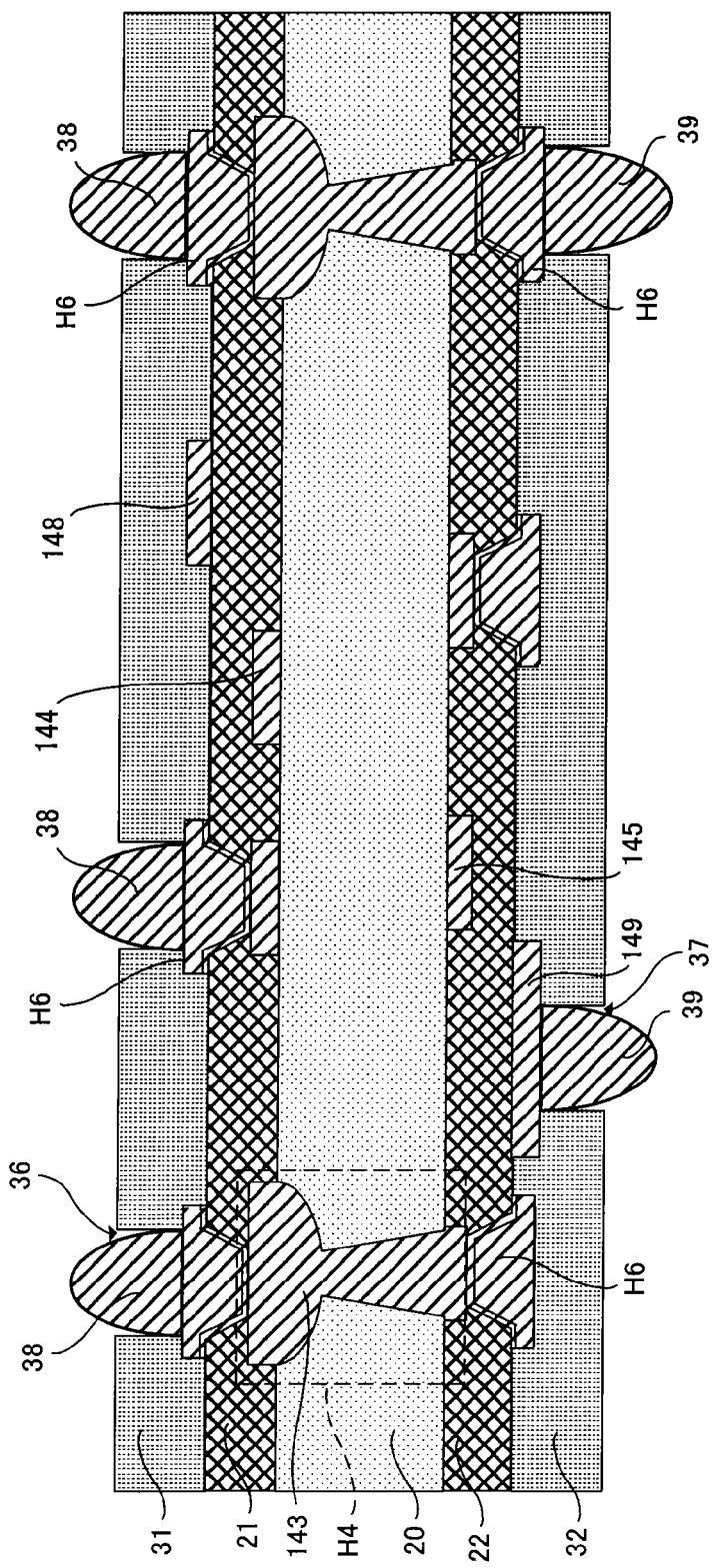

Next, solder pads are formed by forming metal film such as nickel, palladium or gold on conductive circuits (148, 149) and via conductors (H6) exposed through blind holes (36, 37) in solder-resist layers (31, 32). Next, solder paste is printed on solder pads. Then, solder bumps (38, 39) are formed on solder pads by reflow. As shown in FIG. 13D, built-up printed wiring board 200 having solder bumps (38, 39) is electrically connected to electronic components such as an IC chip, or to a daughterboard or the like by means of solder bumps (38, 39).

Figure 14B:
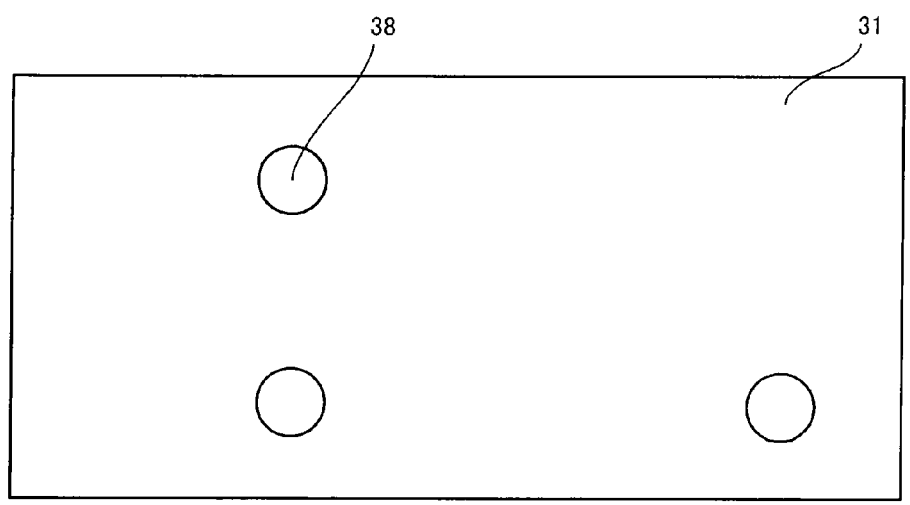
FIG. 14B is a plan view of a multilayer board where solder bumps are formed on a surface of the multilayer board of the applied example.

As shown in FIG. 13D and FIG. 14B, built-up printed wiring board 200 has the following: insulative core substrate 20 having penetrating hole (H4) which is made up of first blind hole (H1) formed in a first surface and second blind hole (H2) formed in a second surface opposite the first surface, and in which first blind hole (H1) and second blind hole (H2) are joined inside the substrate; conductive circuit 144 formed on the first surface of core substrate 20; conductive circuit 145 formed on the second surface of core substrate 20; through-hole conductor 143 made of the metal filled in penetrating hole (H4) and electrically connecting conductive circuit 144 and conductive circuit 145; first interlayer resin insulation layer 21 formed on the first surface of core substrate 20; second interlayer resin insulation layer 22 formed on the second surface of core substrate 20; first conductive circuit 148 formed on the surface of first interlayer resin insulation layer 21; second conductive circuit 149 formed on the surface of second interlayer resin insulation layer 22; via conductor (H6) electrically connecting conductive circuits (144, 145) on core substrate 20 and conductive circuits (148, 149) on interlayer resin insulation layers; solder-resist layer 31 formed on first interlayer resin insulation layer 21 and having blind hole 36 that exposes a solder pad; solder-resist layer 32 formed on second interlayer resin insulation layer 22 and having blind hole 37 that exposes a solder pad; and solder bumps (38, 39) formed on solder pads.

Moreover, the structure and manufacturing method of the above wiring board are examples, and any changes and modifications may be employed.

(a) In the above embodiments, copper-clad laminate 10 where metal layers made of copper are formed on substrate 12 is described. However, a substrate with metal, where metal layers such as nickel other than copper are formed, may be used.

(b) In the above embodiments, copper is used as an example of conductor to fill penetrating hole (H4), but metal other than copper may be filled as well. For example, instead of electroless copper plating, electroless nickel plating may be performed to form electroless plated-nickel film. Also, instead of electrolytic copper plating, electrolytic nickel plating may be performed to form electrolytic plated-nickel film, or electrolytic solder plating may be performed to form electrolytic plated-solder film.

(c) In the above embodiments, electroless copper-plated film is formed by electroless plating, and electrolytic copper-plated film 142 is formed by electrolytic plating. However, to deposit metal, sputtering may also be used. For example, copper is sputtered to form a seed layer made of sputtered-copper film. In addition, by sputtering copper or copper and titanium, sputtered film made of copper or made of copper and titanium may be formed on such a seed layer.

(d) In each embodiment, the order may be reversed when forming first blind hole (H1) and second blind hole (H2). Namely, in each embodiment, second blind hole (H2) is first formed in substrate 12, and then first blind hole (H1) may be formed. After forming penetrating hole (H4), the same procedures may be conducted as in the First Embodiment and the applied example.

Figure 15A:
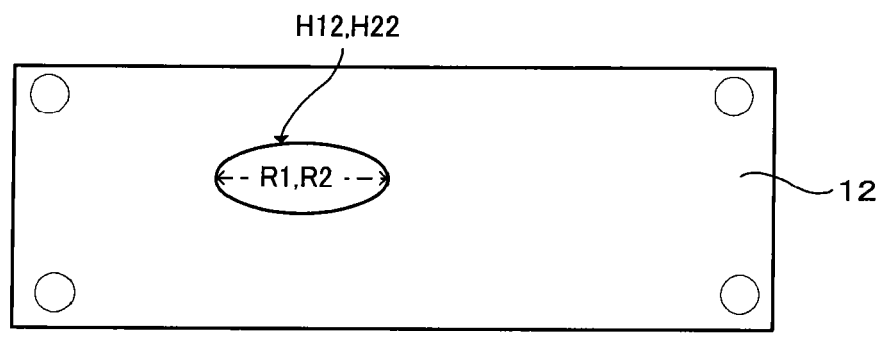
FIG. 15A is a plan view showing an example of blind holes that have an oval opening shape.
Figure 15B:
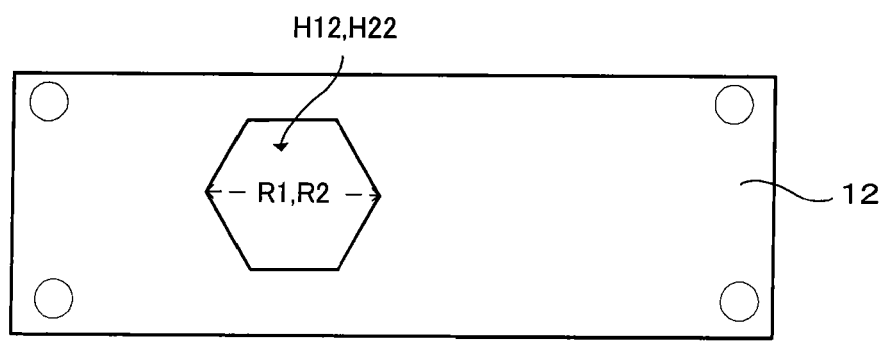
FIG. 15B is a plan view showing an example of blind holes that have a polygonal opening shape.

(e) In each embodiment, examples are shown in which opening (H12) of blind hole (H1) and opening (H22) of blind hole (H2) are circular. However, opening (H12) and opening (H22) may be formed in any shape. For example, as shown in FIG. 15A, openings (H12) and (H22) may be oval. In such a case, for example, the major axes of such ovals are set as diameters (R1) and (R2) of openings (H12) and (H22). Also, as shown in FIG. 15B, openings (H12) and (H22) may be polygonal. In such cases, for example, lines connecting opposite angles (or a side opposite the angle) are set as diameters (R1) and (R2) of openings (H12) and (H22).

(e) In each embodiment, copper-clad laminate 10 is used as a starting material for a printed wiring board. However, substrate 12 may be used instead.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a substrate having a penetrating hole;
a first conductive circuit formed on a first surface of the substrate;
a second conductive circuit formed on a second surface of the substrate on an opposite side with respect to the first surface; and
a through-hole conductor comprising a plating material filling the penetrating hole and connecting the first conductive circuit and the second conductive circuit,
wherein the penetrating hole has a first opening portion and a second opening portion, joined to the first opening portion, the first opening portion has an opening on the first surface having a diameter which is greater than a diameter of an opening of the second opening portion on the second surface, the first opening portion has a depth which is less than a depth of the second opening portion, the depth of the first opening portion is less than half a thickness of the substrate, the depth of the second opening portion is deeper than half the thickness of the substrate, and the first opening portion and second opening portion of the penetrating hole have substantially the same volume.

2. The printed wiring board according to claim 1, wherein a sum of the depth of the first opening portion and the depth of the second opening portion is greater than a thickness of the substrate.

3. The primed wiring board according to claim 2, further comprising a built-up layer formed on one of the first surface and the second surface of the substrate.

4. The printed wiring board according to claim 2, wherein the first opening portion has a straight line passing through the gravity center of the opening of the first opening portion and perpendicular to the first surface such that the straight line is not aligned with a straight line passing through the gravity center of the opening of the second opening portion and perpendicular to the first surface.

5. The printed wiring board according to claim 2, further comprising: a first built-up layer formed on the first surface of the substrate; and a second built-up layer formed on the second surface of the substrate.

6. The printed wiring board according to claim 1, wherein the opening of the first opening portion and the opening of the second opening portion have circular shapes, respectively.

7. The primed wiring board according to claim 6, wherein a sum of the depth of the first opening portion and the depth of the second opening portion is greater than a thickness of the substrate.

8. The printed wiring board according to claim 6, further comprising a built-up layer formed on one of the first surface and the second surface of the substrate, wherein a sum of the depth of the first opening portion and the depth of the second opening portion is greater than a thickness of the substrate.

9. The printed wiring board according to claim 6, further comprising a built-up layer formed on one of the first surface and the second surface of the substrate.

10. The primed wiring board according to claim 6, wherein a sum of the depth of the first opening portion and the depth of the second opening portion is greater than a thickness of the substrate, the first opening portion has a straight line passing through the gravity center of the opening of the first opening portion and perpendicular to the first surface such that the straight line is not aligned with a straight line passing through the gravity center of the opening of the second opening portion and perpendicular to the first surface.

11. The printed wiring board according to claim 6, wherein the first opening portion has a straight line passing through the gravity center of the opening of the first opening portion and perpendicular to the first surface such that the straight line is not aligned with a straight line passing through the gravity center of the opening of the second opening portion and perpendicular to the first surface.

12. The printed wiring board according to claim 1, wherein where a straight line passing through the gravity center of the opening of the first opening portion and perpendicular to the first surface is set as axis Z, and a straight line passing through the gravity center of the opening of the first opening portion and perpendicular to the axis Z is set as axis X, a line of intersection is set as a first line of intersection where X-Z plane intersects an inner wall of the first opening portion, and a line of intersection is set as a second line of intersection where the X-Z plane intersects an inner wall of the second opening portion, and an inclination of a tangent line to the first line of intersection at a point of intersection where the first line of intersection crosses the second line of intersection is greater than an inclination of a tangent line to the second line of intersection at the point of intersection.

13. The printed wiring board according to claim 12, wherein the opening of the first opening portion and the opening of the second opening portion have circular shapes, respectively.

14. The printed wiring board according to claim 1, further comprising a built-up layer formed on one of the first surface and the second surface of the substrate.

15. The printed wiring board according to claim 1, wherein the first opening portion has a straight line passing through the gravity center of the opening of the first opening portion and perpendicular to the first surface such that the straight line is not aligned with a straight line passing through the gravity center of the opening of the second opening portion and perpendicular to the first surface.

16. The printed wiring board according to claim 1, further comprising:
a first built-up layer formed on the first surface of the substrate; and
a second built-up layer formed on the second surface of the substrate.

17. The printed wiring board according to claim 1, wherein the plating material of the through-hole conductor is an electrolytic plating material.

* * * * *